(12) United States Patent
Ohsawa

(10) Patent No.: US 7,872,933 B2
(45) Date of Patent: Jan. 18, 2011

(54) MEMORY DRIVING METHOD AND SEMICONDUCTOR STORAGE DEVICE

(75) Inventor: Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 351 days.

(21) Appl. No.: 12/132,338

(22) Filed: Jun. 3, 2008

(65) Prior Publication Data

US 2008/0316849 A1 Dec. 25, 2008

(30) Foreign Application Priority Data

Jun. 22, 2007 (JP) ............................. 2007-165119

(51) Int. Cl.
*G11C 7/00* (2006.01)

(52) U.S. Cl. .................. 365/222; 365/185.25; 365/207; 365/185.18

(58) Field of Classification Search ............ 365/185.25, 365/222, 185.01, 207, 185.18
See application file for complete search history.

(56) References Cited

U.S. PATENT DOCUMENTS 6,982,918 B2    1/2006  Fazan et al.
7,170,807 B2    1/2007  Fazan et al.
2008/0316849 A1*  12/2008  Ohsawa ..................... 365/222

OTHER PUBLICATIONS

U.S. Appl. No. 12/352,876, filed Jan. 13, 2009, Higashi, et al.
P. Fazan, et al. "A new Block Refresh Concept for SOI Floating Body Memories", IEEE, 2003, pp. 15-16.

* cited by examiner

*Primary Examiner*—Hoai V Ho
*Assistant Examiner*—Jason Lappas
(74) *Attorney, Agent, or Firm*—Oblon, Spivak, McClelland, Maier & Neustadt, L.L.P.

(57) ABSTRACT

This disclosure concerns a method of driving a memory including memory cells, bit lines, and word lines, each memory cell having a source, a drain, and a floating body, the method comprising performing a refresh operation for recovering deterioration of first logical data of the memory cells and deterioration of second logical data of the memory cells, wherein in the refresh operation, the number of the carriers injected into the floating body is larger than the number of the carriers discharged from the floating body when a potential at the floating body is larger than a critical value, and the number of the carriers injected into the floating body is smaller than the number of the carriers discharged from the floating body when the potential at the floating body is smaller than the critical value.

10 Claims, 17 Drawing Sheets

FIG.19 SECOND EMBODIMENT

US 7,872,933 B2

MEMORY DRIVING METHOD AND SEMICONDUCTOR STORAGE DEVICE

CROSS-REFERENCE TO RELATED APPLICATION

This application is based upon and claims the benefit of priority from the prior Japanese Patent Applications No. 2007-165119, filed on Jun. 22, 2007, the entire contents of which are incorporated herein by reference.

BACKGROUND OF THE INVENTION

1. Field of the Invention

The present invention relates to a memory driving method and a semiconductor storage device, particularly to an FBC (Floating Body Cell) memory in which information is stored by accumulating majority carriers in a floating body of a field effect transistor.

2. Related Art

Recently, there is an FBC memory device as a semiconductor storage device expected to be an alternative to a 1T (Transistor)-1C (Capacitor) type DRAM. The FBC memory device is formed by FET (Field Effect Transistor) including a floating body (hereinafter referred to as body) on an SOI (Silicon On Insulator) substrate. In the FBC memory device, data "1" or data "0" is stored according to the number of majority carriers accumulated in the body. For example, in FBC formed by an N-type FET, it is conventionally defined that the data "1" is the state in which many holes are accumulated in the body while the data "0" is the state in which few holes are accumulated in the body. A memory cell in which the data "0" is stored is called a "0" cell and a memory cell in which the data "1" is stored is called a "1" cell.

FBC is excellent in miniaturization compared with a conventional DRAM. However, because the body of FBC has an electrostatic capacity smaller than that of a capacitor of the conventional DRAM, FBC has a data retention time shorter than that of DRAM although a leakage current from the body of FBC is smaller than that from the capacitor of DRAM. Accordingly, it is necessary to frequently perform a refresh operation. As a result, disadvantageously a ratio of a time when usual read and write are prohibited (refresh busy rate) is increased and a current necessary to retain the data is increased compared with the conventional DRAM. In particular, large power consumption becomes a serious problem in portable devices.

Additionally, in the FBC memory, it is necessary that a size of a current driver is enlarged because a current is passed through the memory cell to write the data. Therefore, a chip size is not so decreased although the memory cell has the small size. That is, a proportion of the memory cell to the chip (cell efficiency) is small.

There has been proposed block refresh in order to deal with the problems (P. Fazan, S. Okhonin and M. Nagoga, "A new block refresh concept for SOI floating body memories" IEEE Int. SOI Conference, pp. 15-16, September, 2003). The block refresh is a method, in which holes are supplied only to the "1" cell by impact ionization and the holes are drawn from both the "0" cell and "1" cell by utilizing a charge pumping phenomenon. The charge pumping phenomenon is one in which the holes are drawn from the body as a result of recombination of the holes in the body and electrons trapped by a surface state existing in an interface between a silicon substrate and a gate dielectric film. Accordingly, density of the surface state becomes important. Usually the surface state has the density of about $10^{10}$ cm$^{-2}$. For example, an average of about one surface state exists for a channel having an area of 0.1 μm×0.1 μm. That is, the memory cell having no surface state exists with a considerably high probability. Thus, the block refresh is not the effective method to the memory cell having no surface state, and the block refresh is impractical.

SUMMARY OF THE INVENTION

A method of driving a memory according to an embodiment of the present invention, the memory including memory cells, bit lines, and word lines, each memory cell having a source, a drain, and a floating body in an electrically floating state, the memory cells storing logical data according to the number of carriers in the floating bodies, the bit lines being connected to the drains, the word lines intersecting the bit lines, the method comprises:

performing a refresh operation for recovering deterioration of first logical data of the memory cells and deterioration of second logical data of the memory cells, the number of the carriers accumulated in the floating body of the memory cell storing the second logical data is smaller than that of the memory cell storing the first logical data, wherein in the refresh operation, the number of the carriers injected into the floating body is larger than the number of the carriers discharged from the floating body when a potential at the floating body is larger than a critical value, and the number of the carriers injected into the floating body is smaller than the number of the carriers discharged from the floating body when the potential at the floating body is smaller than the critical value.

A method of driving a memory according to an embodiment of the present invention, the memory including memory cells, bit lines, and word lines, each memory cell having a source, a drain, and a floating body in an electrically floating state, the memory cells storing logical data according to the number of carriers in the floating bodies, the bit lines being connected to the drains, the word lines intersecting the bit lines, the method comprising:

performing a refresh operation for recovering deterioration of first logical data of the memory cells and deterioration of second logical data of the memory cells, the number of the carriers accumulated in the floating bodies of the memory cells storing the second logical data is smaller than that of the memory cells storing the first logical data, wherein a common word line potential VWL at the word lines and a common bit line potential VBL at the bit lines are applied to the memory cells storing the first logical data and the memory cells storing the second logical data during the refresh operation, the potential VWL and the potential VBL satisfying the formula group of formula 1 to formula 4 or the formula group of formula 5 to formula 8, $$\begin{cases} VBL > VSL & \text{(formula 1)} \\ 0 < VWL - VSL \le Vth0 & \text{(formula 2)} \\ VBL \ge VWL - Vth1 & \text{(formula 3)} \\ VWL > VWLL & \text{(formula 4)} \end{cases}$$

$$\begin{cases} VBL < VSL & \text{(formula 5)} \\ VWL - VSL \le Vth1 & \text{(formula 6)} \\ VWL > VBL \ge VWL - Vth0 & \text{(formula 7)} \\ VWL > VWLL & \text{(formula 8)} \end{cases}$$

where VSL is a potential at the source, Vth1 is a threshold voltage of the memory cell in which the first logical data is stored, Vth0 is a threshold voltage of the memory cell in which the second logical data is stored, and VWLL is a potential at the word line during data retention.

A method of driving a memory according to an embodiment of the present invention, the memory including memory cells, bit lines, and word lines, each memory cell having a source, a drain, and a floating body in an electrically floating state, the memory cells storing logical data according to the number of carriers in the floating bodies, the bit lines being connected to the drains, the word lines intersecting the bit lines, the method comprising:

performing a refresh operation for recovering deterioration of first logical data of the memory cells and deterioration of second logical data of the memory cells, the number of the carriers accumulated in the floating body of the memory cell storing the second logical data is smaller than that of the memory cell storing the first logical data, wherein the refresh operation includes:

a first cycle in which a low potential lower than the potentials of the bit line and the source is applied to the word line, and a second cycle in which a common word line potential VWL at the word lines and a common bit line potential VBL at the bit lines are applied to the memory cells storing the first logical data and the memory cells storing the second logical data, the potential VWL and the potential VBL satisfying the formula group of formula 1 to formula 4 or the formula group of formula 5 to formula 8, $$\begin{cases} VBL > VSL & \text{(formula 1)} \\ 0 < VWL - VSL \leq Vth0 & \text{(formula 2)} \\ VBL \geq VWL - Vth1 & \text{(formula 3)} \\ VWL > VWLL & \text{(formula 4)} \end{cases}$$

$$\begin{cases} VBL < VSL & \text{(formula 5)} \\ VWL - VSL \leq Vth1 & \text{(formula 6)} \\ VWL > VBL \geq VWL - Vth0 & \text{(formula 7)} \\ VWL > VWLL & \text{(formula 8)} \end{cases}$$

where VSL is a potential at the source, Vth1 is a threshold voltage of the memory cell in which the first logical data is stored, Vth0 is a threshold voltage of the memory cell in which the second logical data is stored, and VWLL is a potential at the word line during data retention.

A semiconductor storage device according to an embodiment of the present invention comprises memory cells, each of which has a source, a drain, and a floating body in an electrically floating state, the memory cells storing logical data according to the number of carriers in the floating bodies; bit lines connected to the drains; and word lines intersecting the bit lines, wherein, in performing a refresh operation for recovering deterioration of a first logical data of the memory cells and deterioration of a second logical data of the memory cells, the number of the carriers accumulated in the floating body of the memory cell storing the second logical data is smaller than that of the memory cell storing the first logical data, in the refresh operation, the number of carriers injected into the floating body is larger than the number of majority carriers discharged from the floating body when a potential at the floating body is larger than a critical value, and the number of carriers injected into the floating body is smaller than the number of carriers discharged from the floating body when the potential at the floating body is smaller than the critical value.

DETAILED DESCRIPTION OF THE INVENTION

Exemplary embodiments of the invention will be described below with reference to the drawings. However, the invention is not limited to the following embodiments.

First Embodiment

Figure 1:
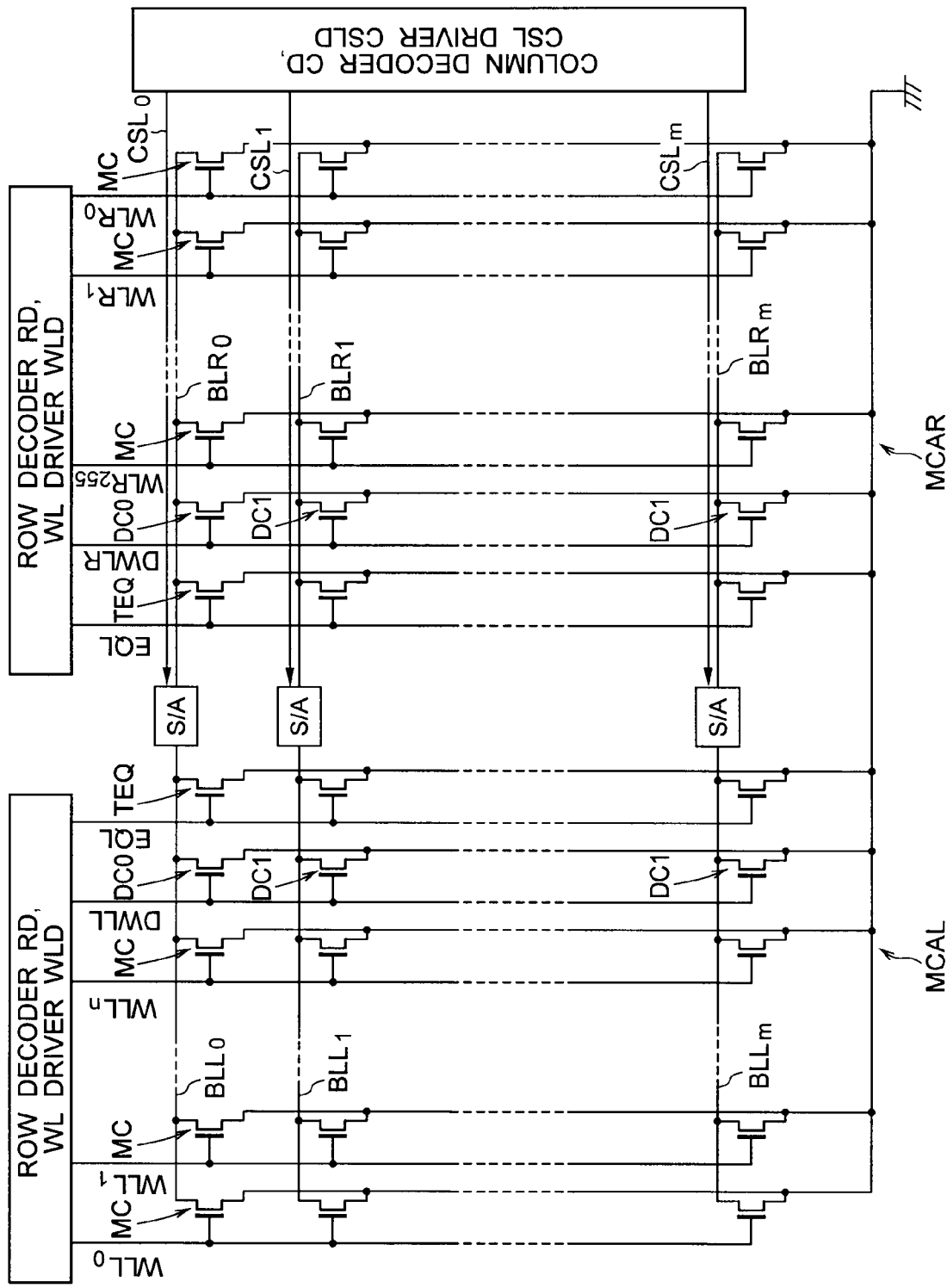
FIG. 1 shows an example of a configuration of an FBC memory according to a first embodiment of the invention.

FIG. 1 shows an example of a configuration of an FBC memory according to a first embodiment of the invention. The FBC memory device includes a memory cell MC, dummy cells DC0 and DC1, word lines WLL0 to WLLn and WLR0 to WLRn (hereinafter also referred to as WL), dummy word lines DWLL and DWLR (hereinafter also referred to as DWL), bit lines BLL0 to BLLm and BLR0 to BLRm (hereinafter also referred to as BL), a sense amplifier S/A, an equalizing line EQL, an equalizing transistor TEQ, a row decoder RD, a WL driver WLD, a column decoder CD, and a CSL driver CSLD.

The memory cells MC are arrayed in a matrix shape to form memory cell arrays MCAL and MCAR (hereinafter also referred to as MCA). The word line WL is extended in a row direction and connected to a gate of the memory cell MC. Each (n+1) word lines WL are provided on either side of the sense amplifier S/A. The bit line BL is extended in a column direction and connected to a source or a drain of the memory cell MC. Each (m+1) bit lines BL are provided on either side of the sense amplifier S/A. The word line WL and the bit line BL are orthogonal to each other, and the memory cell MC is provided at each cross point. This configuration is called a cross-point type cell. The appellations of the row direction and the column direction is expediency, and they may be replaced with each other.

In advance of the data read/write operation, data "0" and data "1" which are of the opposite polarity to each other are stored in the dummy cells DC0 and DC1 respectively. The polarity indicates a logical value "0" or "1" of the data. The dummy cells DC0 and DC1 are used to generate a reference current Iref when the data of the memory cell MC is detected. The dummy cells DC0 and dummy cells DC1 of the same number are provided in order to generate the reference current Iref. The reference current Iref is a substantially intermediate current between the current passed through the "0" cell and the current passed through the "1" cell. The sense amplifier S/A supplies the current to the memory cell MC through the bit line BL. Therefore, the current is passed through a sense node in the sense amplifier S/A according to the data of the memory cell MC. The sense amplifier S/A distinguishes between the logical values "1" and "0" of the data based on whether or not the current passed through the sense node is higher than the reference current Iref.

The equalizing line EQL is connected to a gate of the equalizing transistor TEQ. The equalizing transistor TEQ is connected between the bit line BL and a ground (ground potential). In equalizing, the potential at each bit line BL is equalized to the ground potential by connecting the bit line BL to the ground.

The row decoder RD decodes a row address to select a specified word line in the plural word lines WL. The WL driver WLD applies a voltage to a selected word line to activate the selected word line. The column decoder CD decodes a column address to select a specified column in the plural columns. The CSL driver CSLD applies the potential to the selected column to read or write the data from or to the sense amplifier S/A through a DQ buffer.

The activation shall mean that an element or a circuit is turned on or driven, and the inactivation shall mean that the element or the circuit is turned off or stopped. Accordingly, it is noted that sometimes a HIGH (high potential level) signal is an activation signal and sometimes a LOW (low potential level) signal is an activation signal. For example, an NMOS transistor is activated by setting a gate to HIGH. On the other hand, a PMOS transistor is activated by setting the gate to LOW.

Figure 2:
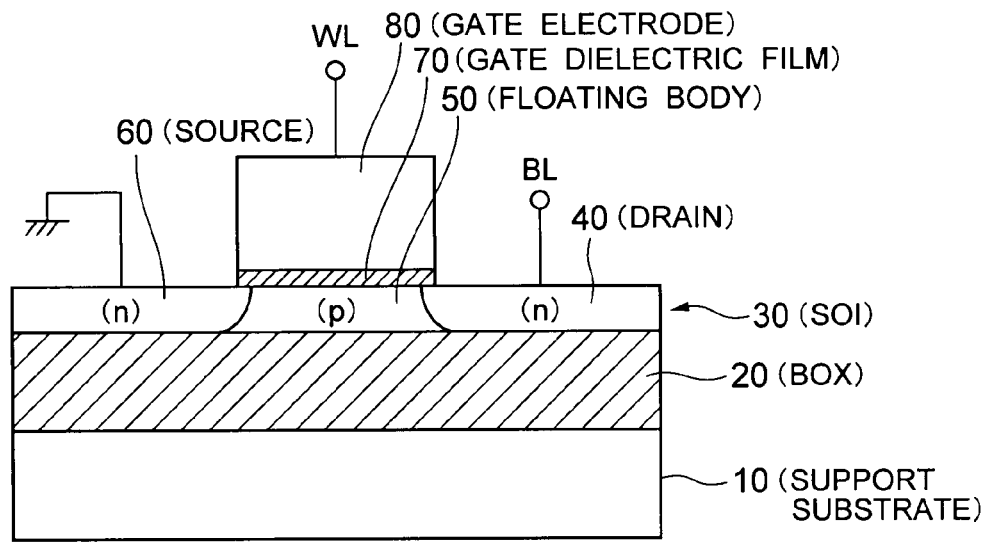
FIG. 2 is a sectional view showing an example of a structure of the memory cell MC.

FIG. 2 is a sectional view showing an example of a structure of the memory cell MC. The dummy cell DC has the configuration similar to that of the memory cell MC. The memory cell MC is provided on an SOI substrate including a support substrate 10, a BOX layer 20, and an SOI layer 30. A source 60 and a drain 40 are provided in an SOI layer 30. A floating body 50 is provided in the SOI layer 30 between the source 60 and the drain 40. The body 50 is a semiconductor whose conductive type is opposite to those of the source 60 and drain 40. In the first embodiment, the memory cell MC is the N-type FET. The body 50 is in an electrically floating state by surrounding a part or all the body 50 with the source 60, the drain 40, the BOX layer 20, a gate dielectric film 70, and a STI (Shallow Trench Isolation) (not shown). In the FBC memory, logical data (binary data) can be stored according to the number of majority carriers accumulated in the body 50.

One of methods of writing the data in the memory cell MC will be described below. The memory cell MC is operated in a saturated state in order to write the data "1" in the memory cell MC. For example, the word line WL is biased to 1.5V and the bit line BL is biased to 1.5V. The source is set to the ground GND (0V). Therefore, the impact ionization occurs near the drain to generate a large amount of electron-hole pairs. The electrons generated by the impact ionization flow to the drain, and the holes are accumulated in the body having a low potential. The body voltage reaches an equilibrium state when a balance is achieved between a current passed in generating the holes by the impact ionization and a forward current in a pn junction between the body and the source. The body has the voltage of about 0.7V.

In writing the data "0", the bit line BL is decreased to a negative voltage. For example, the potential at the bit line BL is decreased to −1.5V. This operation largely biases the pn junction between the body 50 and the drain 40 toward a forward direction. The holes accumulated in the body 50 are discharged to the drain 40, and the data "0" is stored in the memory cell MC.

One of methods of reading the data from the memory cell MC will be described below. In the data read operation, similarly to the data write operation, although the word line WL is activated, the bit line BL is set to a lower level compared with the write operation of the data "1". For example, the word line WL is set to 1.5V and the bit line BL is set to 0.2V. The memory cell MC is operated within a linear region. The "0" cell differs from the "1" cell in a threshold voltage of the memory cell MC due to the difference of the number of holes stored in the body 50. The distinction between the data "1" and the data "0" can be made by detecting the difference in threshold voltage. The reason why the bit line BL is set to the lower voltage during the data read is that, when the voltage of the bit line BL is increased to bias the memory cell MC to the saturated state, the "0" cell is possibly changed to the "1" cell by the impact ionization in reading the data "0".

The refresh operation shall mean an operation which recovers the deteriorated data of the "1" cell or "0" cell. More particularly, the refresh operation is one which replenishes the holes to the "1" cell while drawing the holes from the "0" cell. Through the refresh operation, a difference in signal between the data "1" and the data "0" is recovered to a level substantially identical to that in writing the data.

In the conventional refresh, the sense amplifier tentatively reads the data from the memory cell MC and the sense amplifier writes the same logical data as the data in the memory cell MC again. However, in the refresh of the first embodiment, the sense amplifier does not read the data from the memory cell MC. In the refresh of the first embodiment, the properly same word line potential VWL and the properly same bit line potential VBL are applied to both the "0" cell and the "1" cell without reading the data, and the difference in body potential between the "0" cell and the "1" cell is utilized to autonomously refresh both the "0" cell and the "1" cell at the same time. The refresh is called "autonomous refresh". Conditions which the word line potential VWL and the bit line potential VBL should satisfy are described later.

Figures 3A, 3B:
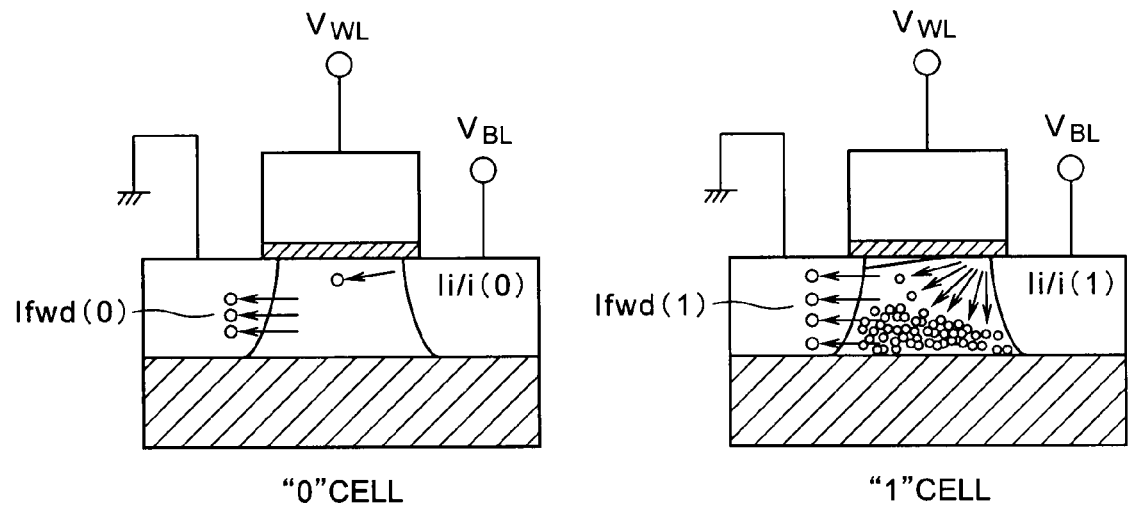
FIGS. 3A and 3B are conceptual views showing the autonomous refresh operation.

FIGS. 3A and 3B are conceptual views showing the autonomous refresh operation. FIG. 3A shows a state when the autonomous refresh operation of the "0" cell is started, and FIG. 3B shows a state when the autonomous refresh operation of the "1" cell is started. The word line potential VWL and the bit line potential VBL are set within a range shown in FIG. 4.

The word line potential VWL and the bit line potential VBL are set larger than the source line potential VSL (for example, ground potential (0V)), whereby the potential at each body 50 of the "0" cell and "1" cell is increased higher than the source potential VSL by capacity coupling between the word line WL and the body 50 and capacity coupling between the bit line BL and the body 50. Therefore, the forward bias is applied to the pn junction between the body and the source. The forward bias draws the holes in the body 50 to the source 60. The holes are drawn in both the "0" cell and the "1" cell. The current by the impact ion generated in the junction between the body and the drain in the "1" cell can be set larger than that in the "0" cell by selecting proper values of the bit line potential VBL and word line potential VWL.

At this point, in the "0" cell, the number of holes (forward current Ifwd(0)) drawn per unit time by the forward bias between the body and the source is larger than the number of holes (impact ionization current Ii/i(0)) generated per unit time by the impact ionization between the body and the drain as shown in FIG. 3A. At the same time, in the "1" cell, the number of holes (forward current Ifwd(1)) drawn per unit time by the forward bias between the body and the source is smaller than the number of holes (impact ionization current Ii/i(1)) generated per unit time by the impact ionization between the body and the drain as shown in FIG. 3B. Therefore, the holes accumulated in the "0" cell can be decreased while the holes are replenished to the "1" cell.

(Case 1: VBL>VSL)

Figure 4:
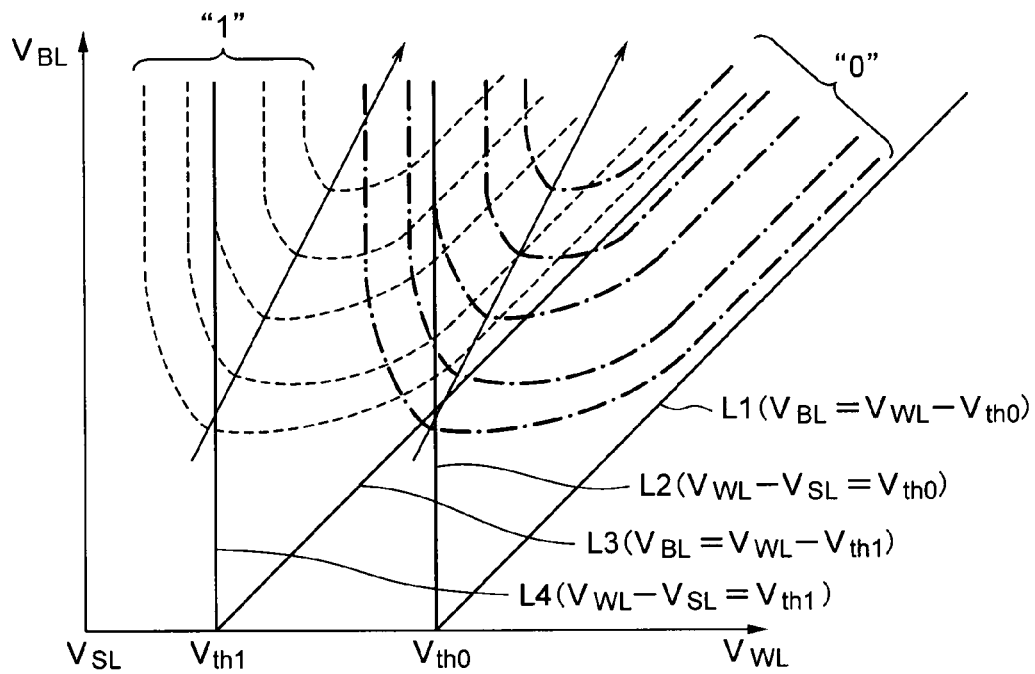
FIG. 4 is a graph showing a contour of a rate of the hole generated by the impact ionization with respect to the "0" cell and "1" cell.

FIG. 4 is a graph showing a contour of a rate of the hole generated by the impact ionization with respect to the "0" cell and "1" cell. Vth1 designates a threshold voltage of the "1" cell and Vth0 designates a threshold voltage of the "0" cell. In FIG. 4, the contour of the hole generation rate in the "1" cell is indicated by a broken line, and the contour of the hole generation rate in the "0" cell is indicated by an alternate long and short dash line. The lines L1 to L4 of FIG. 4 are identical to those of FIG. 5. However, in FIG. 4, the source line potential VSL is set to an origin for the purpose of easy understanding.

The line L1 of FIG. 4 indicates VBL=VWL−Vth. A lower right region of the line L1 indicates a liner region of the "0" cell, and an upper left region of the line L1 indicates a weak inversion region and a saturated region. The line L2 indicates VWL=Vth0. A region between the line L2 and the line L1 indicates the saturated region of the "0" cell. A left side region of the line L2 indicates the weak inversion region of the "0" cell. The line L3 indicates VBL=VWL−Vth1. A lower right region of the line L3 indicates the liner region of the "1" cell, and an upper left region of the line L3 indicates the weak inversion region and the saturated region. The line L4 indicates VWL=Vth1. A region between the line L4 and the line L3 indicates the saturated region of the "1" cell. A left side of the line L4 indicates the weak inversion region of the "1" cell. The impact ionization occurs mainly when the memory cell MC is in the saturated state, and sometimes the impact ionization also occurs in the weak inversion state.

As shown by arrows of FIG. 4, in both the "0" cell and the "1" cell, the rate of the hole generated by the impact ionization is increased when the word line potential VWL and the bit line potential VBL are increased. However, for the "0" cell, the impact ionization is not generated in the liner region (VBL<VWL−Vth0) located in the lower right region of the line L1. For the "1" cell, the impact ionization is not generated in the liner region (VBL<VWL−Vth1) located in the lower right region of the line L3. It should be noted that the rate of the hole generated by the impact ionization in the "1" cell is larger than that in the "0" cell when the word line potential VWL is smaller than Vth0 based on the source line potential VSL (VWL−VSL≦Vth0). In other words, the impact ionization current Ii/i(1) in the "1" cell becomes larger than the impact ionization current Ii/i(0) in the "0" cell by satisfying the VWL−VSL≦Vth0. For example, in the case where VWL is set near Vth0, the impact ionization current Ii/i(0) in the "0" cell is not substantially increased even if the bit line potential VBL is increased, although the impact ionization current Ii/i(1) in the "1" cell is increased.

It is necessary that the word line potential VWL be larger than the source line potential VSL. The word line potential VWL is larger than the source line potential VSL, which allows the potential at the body 50 to be surely higher than the potential at the source 60. Therefore, the forward bias is applied to the pn junction between the body and the source to draw the holes in the body 50 to the source 60. That is, it is necessary that the word line potential VWL be Vth0 or less based on the source line potential VSL and larger than the source line potential VSL.

During the data retention, usually the word line potential VWLL is set lower than the source line potential VSL. Therefore, in Case 1, the word line potential VWL during the refresh operation is larger than the word line potential VWLL during the data retention.

The above-described conditions are expressed by a formula 1 to a formula 4.

$$VBL > VSL \quad \text{(formula 1)}$$

$$0 < VWL - VSL \leq Vth0 \quad \text{(formula 2)}$$

$$VBL > VWL - Vth1 \quad \text{(formula 3)}$$

$$VWL > VWLL \quad \text{(formula 4)}$$

In order to perform the autonomous refresh, it is necessary that the word line potential VWL and the bit line potential VBL be set so as to satisfy the formula 1 to formula 4.

Figure 5:
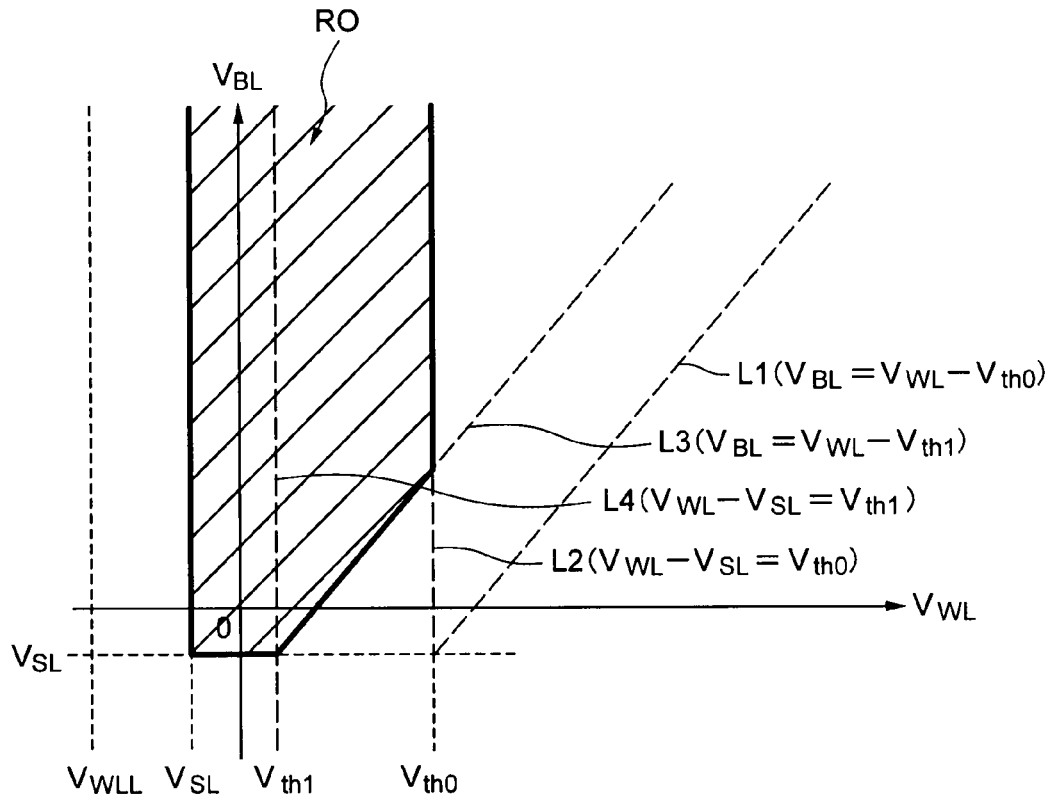
FIG. 5 is a graph showing ranges of the word line potential VWL and bit line potential VBL, in which the autonomous refresh can be performed in Case 1.

FIG. 5 is a graph showing ranges of the word line potential VWL and bit line potential VBL, in which the autonomous refresh can be performed in Case 1. In FIG. 5, the formula 1 to formula 4 are indicated by a range R0 shown by oblique lines with a heavy-line boundary. The autonomous refresh can be realized by equally applying one of the word line potential VWL and bit line potential VBL within the range R0 to the "0" cell and "1" cell.

Figure 6:
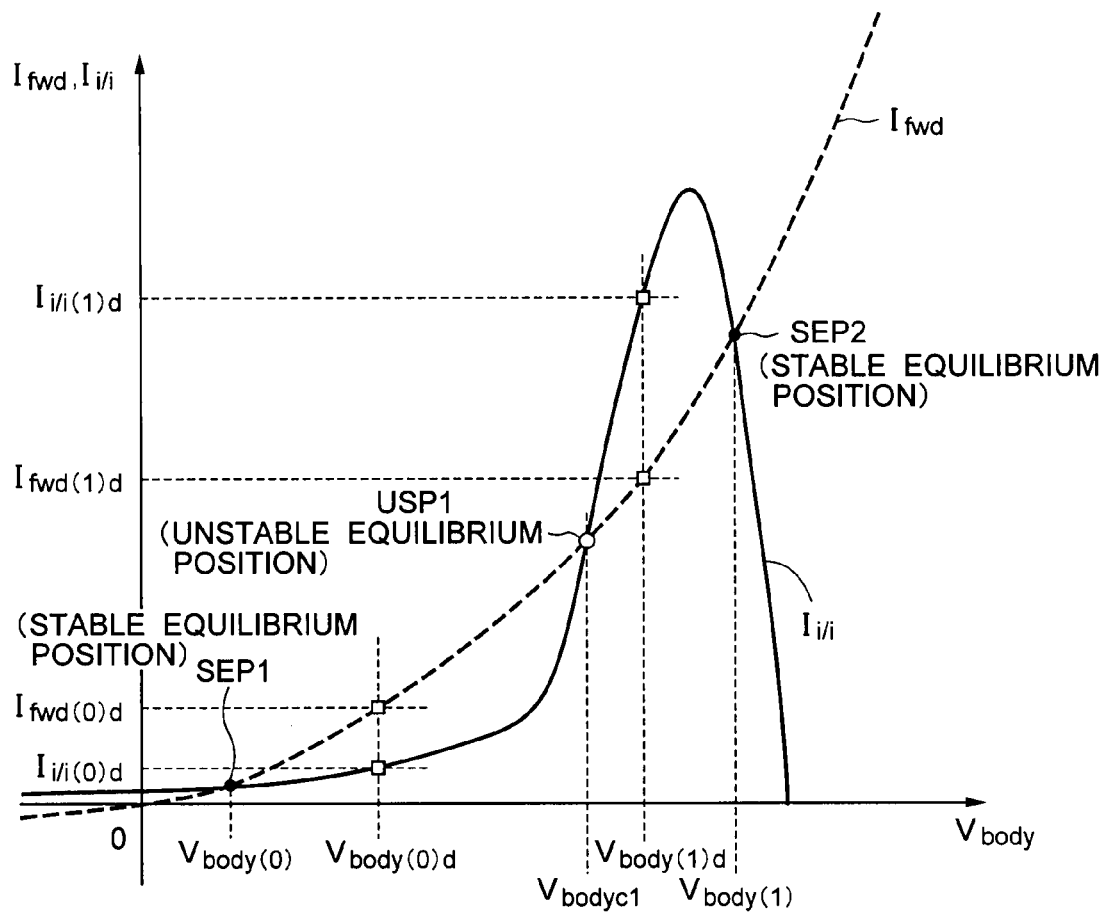
FIG. 6 is a graph showing dependence of the forward current Ifwd and impact ionization current Ii/i on the body potential for realizing the autonomous refresh.

FIG. 6 is a graph showing dependence of the forward current Ifwd and impact ionization current Ii/i on the body potential for realizing the autonomous refresh. Vbody(0)d indicates the state in which the holes are accumulated to an extent in the body of the "0" cell to deteriorate the data "0". Vbody(1)d indicates the state in which the holes are emitted to an extent from the body of the "1" cell to deteriorate the data "1". Vbody(0) and Vbody(1) indicate the body potentials of the "0" cell and "1" cell immediately after the autonomous refresh or write.

Usually the forward current Ifwd is expressed by an exponential function of body potential Vbody when the source line potential VSL and the bit line potential VBL are kept constant. In the autonomous refresh of the first embodiment, the equal bit line potential VBL, equal word line potential VWL, and equal source line potential VSL are always applied to the "0" cell and "1" cell during the refresh period. Therefore, the difference in forward current Ifwd between the "0" cell and "1" cell depends on the difference in body potential between the "0" cell and "1" cell.

The intersection of the forward current Ifwd and the impact ionization current Ii/i indicates an equilibrium position in which the impact ionization current is equal to the forward current. The equilibrium position includes two stable equilibrium positions SEP1 and SEP2 and one unstable equilibrium position USP. The unstable equilibrium position USP exists between the stable equilibrium positions SEP1 and SEP2.

The unstable equilibrium position USP is in the equilibrium state (the impact ionization current is equal to the forward current) although being in the unstable state. That is, when the unstable equilibrium position USP is slightly shifted from the equilibrium state by noise or the like, the shift is increased. In the case where the "0" cell and "1" cell are deteriorated beyond a body voltage Vbodyc1 at the unstable equilibrium position (i.e., Vbody(0)d>Vbodyc1 or Vbody(1)d<Vbodyc1), the "0" cell and "1" cell cannot be recovered to the original storage state by the autonomous refresh operation. Accordingly, the unstable equilibrium position USP becomes a critical point when the autonomous refresh is performed.

In the following description, it is assumed that the "0" cell and "1" cell are not deteriorated beyond the critical point Vbodyc1. The autonomous refresh is performed to the "0" cell in which the data is deteriorated and the "1" cell in which the data is deteriorated. The body potentials at the "0" cell and "1" cell are brought close to each other by the data deterioration like Vbody(0)d and Vbody(1)d of FIG. 6.

Under such circumstances, when the word line potential VWL and the bit line potential VBL are set so as to satisfy the formula 1 to formula 4, as shown in FIG. 6, the forward current Ifwd(0)d of the "0" cell becomes larger than the impact ionization current Ii/i(0)d and the impact ionization current Ii/i(1)d of the "1" cell becomes larger than the forward current Ifwd(1)d of the "1" cell.

Because the forward current Ifwd(0)d is larger than the impact ionization current Ii/i(0)d, the holes are drawn in the "0" cell, and the body potential is gradually lowered. When the body potential is lowered, the forward current Ifwd is gradually decreased. When the forward current Ifwd is equal to the impact ionization current Ii/i, the "0" cell becomes the equilibrium state. Vbody(0) indicates the body potential at the "0" cell in the equilibrium state.

On the other hand, in the "1" cell, because the impact ionization current Ii/i(1)d is larger than the forward current Ifwd(1)d, the holes are accumulated and the body potential is gradually increased. When the body potential is increased, the forward current Ifwd is increased. When the forward current Ifwd is equal to the impact ionization current Ii/i, the "1" cell becomes the equilibrium state. Vbody(1) indicates the body potential at the "1" cell in the equilibrium state.

Thus, in the autonomous refresh, the body potentials at the "0" cell and "1" cell which are biased by the word line potential VWL and bit line potential VBL are promoted toward the equilibrium state and amplified. Therefore, after the autonomous refresh, the signal difference (potential difference) between the "0" cell and "1" cell can substantially be recovered to that in the data write.

In the case where the "0" cell and "1" cell are largely deteriorated by the large noise or the like, sometimes the "0" cell and "1" cell are not recovered to the original equilibrium state by the one-cycle autonomous refresh. In such cases, the "0" cell and "1" cell can finally be recovered to the stable equilibrium state by repeatedly performing the plural-cycle autonomous refresh. However, in such cases, it is assumed that the body potentials at the "0" cell and "1" cell are not deteriorated beyond the critical point Vbodyc1.

Figure 7:
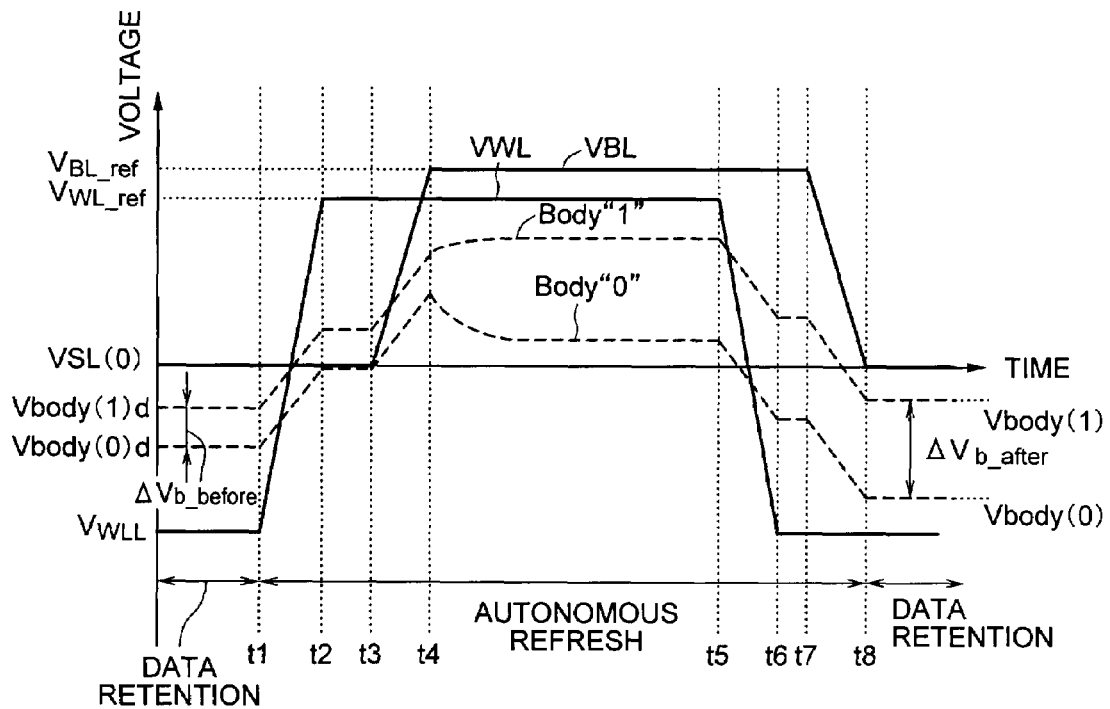
FIG. 7 is a timing chart showing an operation performed by the FBC memory of the first embodiment.

FIG. 7 is a timing chart showing an operation performed by the FBC memory of the first embodiment. In FIG. 7, the source line potential VSL is set to the ground potential (0V). First the data "1" or data "0" is written in each memory cell MC in the memory cell array MCA. In the data retention state (0 to t1), the word line potential VWL is set to the negative potential VWLL such that the reverse bias is applied to the pn junction between the body and the source and the pn junction between the body and the drain. At this point, the bit line potential VBL and the source line potential VSL are higher than the word line potential VWLL. For example, in FIG. 7, the bit line potential VBL and the source line potential VSL are set to the ground potential. Therefore, the leakage currents passed through the pn junction between the body and the source and the pn junction between the body and the drain are suppressed to lengthen a data retention time.

When a transition is made from the data retention state to the refresh operation (t1 to t2), the word line potential VWL rises up from a level VWLL in the data retention to VWL_ref which is higher than the level VWLL. VWL_ref is a positive potential higher than the ground potential. Then, in t3 to t4, the bit line potential VBL is raised to VBL_ref which is higher than a level (VSL=0) in the data retention. In t4 to t5, the word line potential VWL_ref and the bit line potential VBL_ref are potentials satisfying the formula 1 to formula 4, and the autonomous refresh is performed in this period. The source line potential VSL is kept at the ground potential.

When the word line potential VWL and the bit line potential VBL are set to VWL_ref and VBL_ref, the body potentials at the "0" cell and "1" cell are raised by the capacity coupling between the body and the gate and the capacity coupling between the body and the drain. However, because the body potential at the "1" cell is originally higher than the body potential at the "0" cell, the body potential at the "1" cell is raised to a potential higher than the body potential at the "0" cell in the beginning of the rising of the word line potential VWL and the bit line potential VBL. A threshold voltage difference between the "0" cell and "1" cell is generated by the potential difference ΔVb_before. Accordingly, as described above, although the equal bit line potential and the equal word line potential are applied to the "0" cell and "1" cell, the "0" cell differs from the "1" cell in the impact ionization current Ii/i and the forward current Ifwd.

In the "1" cell, the high potential can be maintained because the impact ionization current Ii/i is larger than the forward current Ifwd. In the "0" cell, the body potential is lowered because the forward current Ifwd is larger than the impact ionization current Ii/i. Therefore, the body potential difference between the "1" cell and "0" cell is amplified.

During the autonomous refresh, usually the word line potentials VWL_ref applied to the "0" cell and "1" cell are equal to each other, the bit line potentials VBL_ref applied to the "0" cell and "1" cell are equal to each other, and the source line potentials VSL (ground potential) applied to the "0" cell and "1" cell are equal to each other.

Then, in t5 to t6, the word line potential VWL falls to the negative potential level in the data retention. In t7 to t8, the bit line potential VBL falls to the ground level in the data retention. Therefore, the autonomous refresh operation is completed and the memory becomes the data retention state again.

As is clear from FIG. 7, a body potential difference ΔVb_after between the "0" cell and "1" cell after the autonomous refresh is amplified larger than the body potential difference ΔVb_before between the "0" cell and "1" cell before the autonomous refresh operation.

Figure 8:
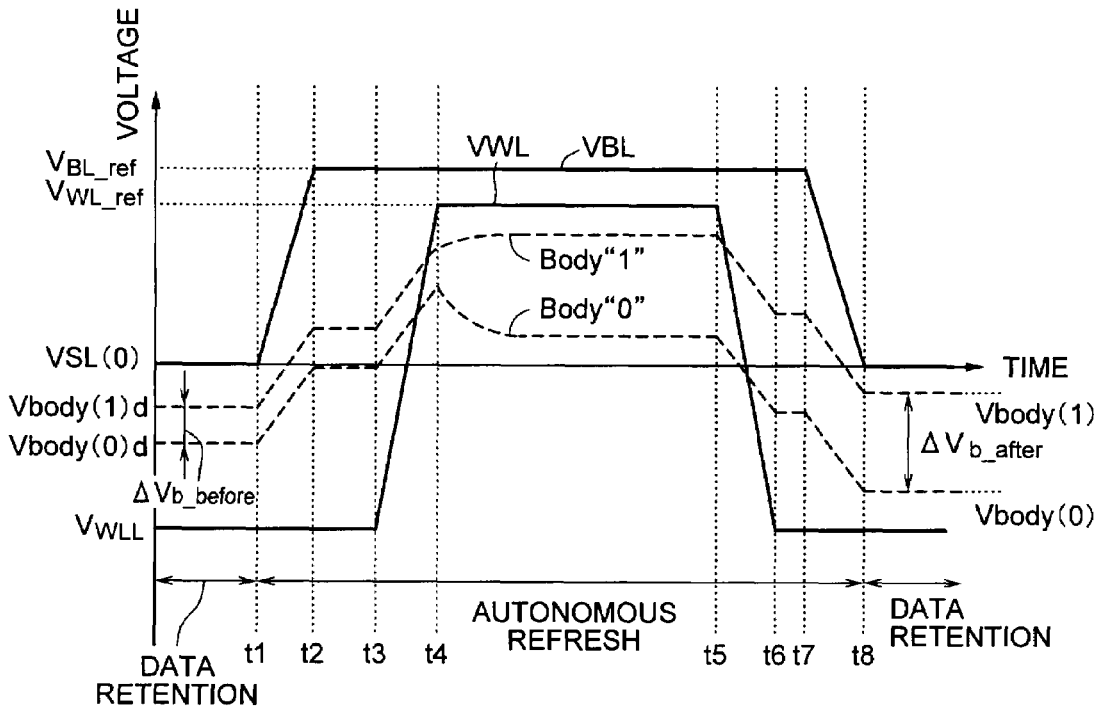
FIG. 8 is a timing chart showing another operation performed by the FBC memory of the first embodiment.

FIG. 8 is a timing chart showing another operation performed by the FBC memory of the first embodiment. The operation of FIG. 8 has the opposite rising procedures (t1 to t4) of the word line potential VWL and bit line potential VBL to those of FIG. 7. Other procedures in the operation of FIG. 8 are similar to those of FIG. 7. As shown in FIG. 8, even if the rising procedures of the word line potential VWL and bit line potential VBL are opposite to those of FIG. 7, the autonomous refresh can be performed like the operation of FIG. 7.

Figure 9:
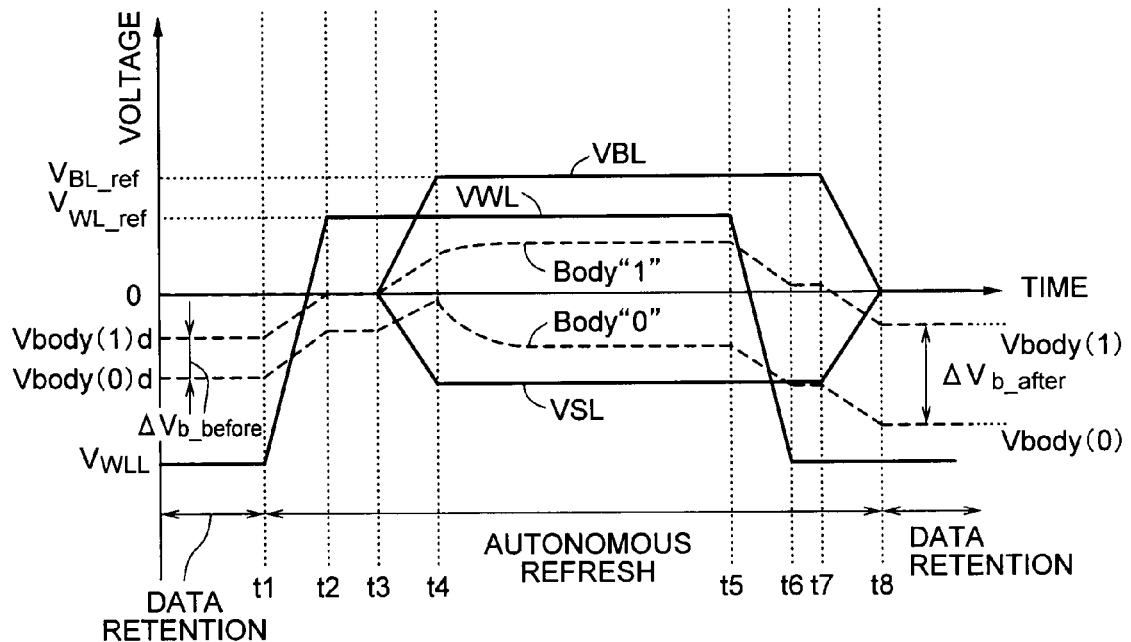
FIG. 9 is a timing chart showing still another operation performed by the FBC memory of the first embodiment.

FIG. 9 is a timing chart showing still another operation performed by the FBC memory of the first embodiment. In the operation of FIG. 9, during the autonomous refresh, the source line potential VSL falls to a negative potential lower than a level in the data retention state. At this point, the word line potential VWL rises up to the potential VWL_ref higher than the ground potential, and the bit line potential VBL rises up to the potential VBL_ref higher than the ground potential.

Thus, the source line potential VSL is caused to change during the autonomous refresh, which allows the forward current between the body and the source to be increased. Other procedures in the autonomous refresh operation of FIG. 9 are similar to those of FIG. 7.

Figure 10:
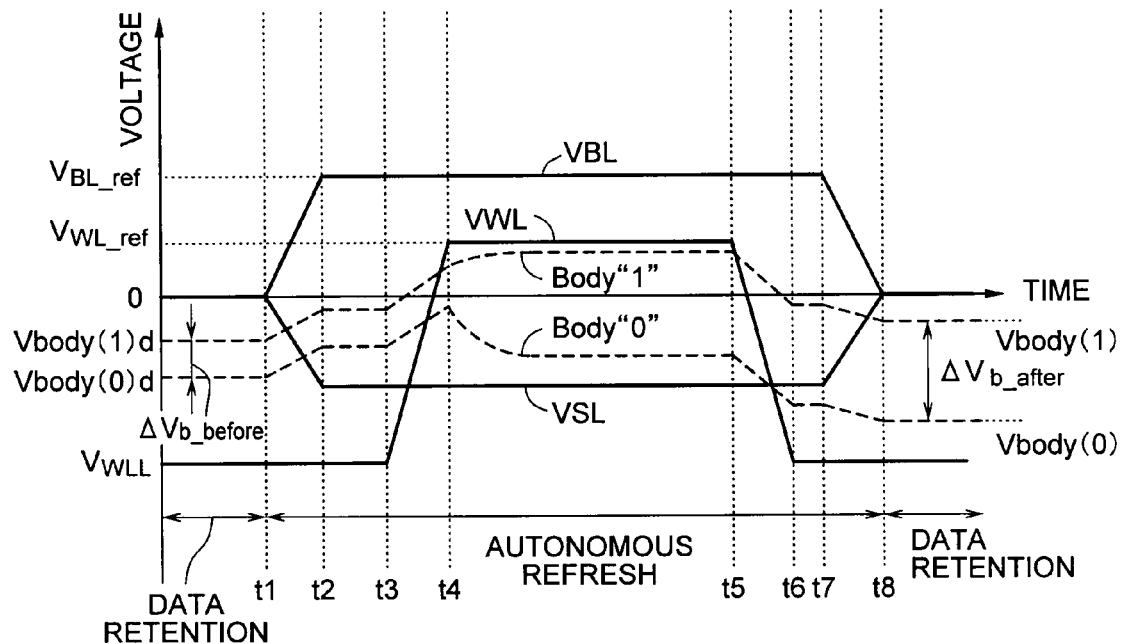
FIG. 10 is a timing chart showing still another operation performed by the FBC memory of the first embodiment.

FIG. 10 is a timing chart showing still another operation performed by the FBC memory of the first embodiment. The operation of FIG. 10 has the opposite rising procedures (t1 to t4) of the word line potential VWL and bit line potential VBL to those of FIG. 9. Other procedures in the operation of FIG. 10 are similar to those of FIG. 9. As shown in FIG. 10, even if the rising procedures of the word line potential VWL and bit line potential VBL are opposite to those of FIG. 9, the autonomous refresh can be performed like the operation of FIG. 9.

(Case 2: VBL<VSL)

The autonomous refresh can be performed even if VBL is lower than VSL. In this case, the holes are drawn from the body 50 by applying the forward bias to the junction portion between the body and the drain. The impact ionization occurs between the body and the source. In the "1" cell, the number of holes drawn by the forward bias between the body and the drain is smaller than the number of holes generated by the impact ionization between the body and the source. In the "0" cell, the number of holes drawn by the forward bias between the body and the drain is larger than the number of holes generated by the impact ionization between the body and the source. Therefore, both the "1" cell and the "0" cell can autonomously be refreshed.

Figure 11:
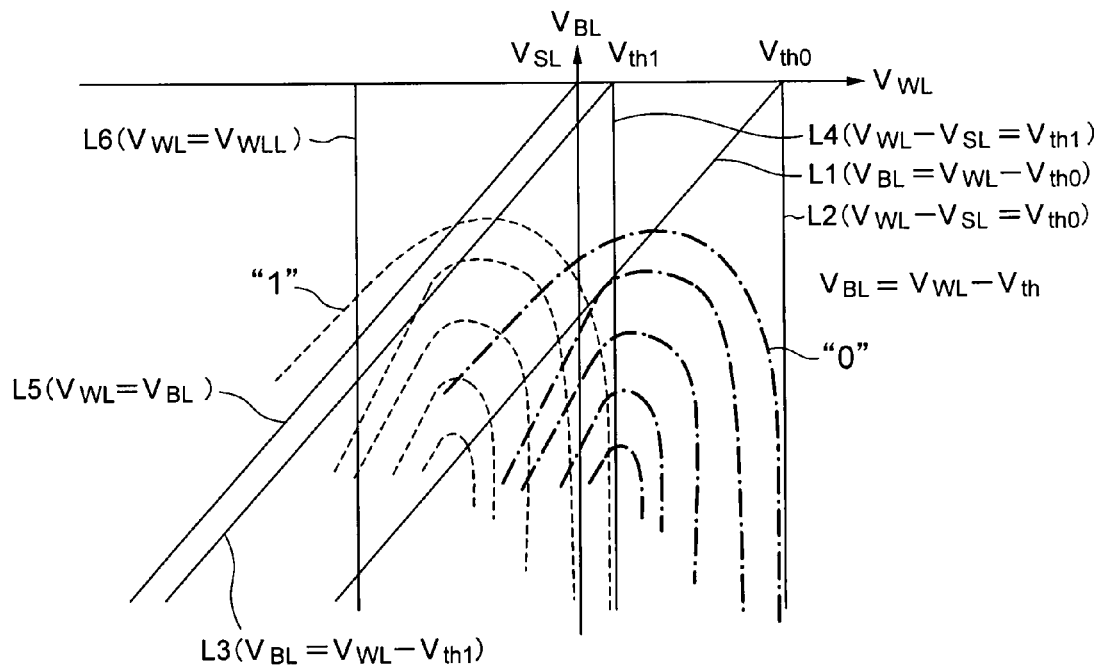
FIG. 11 is a graph showing a contour of a rate of the hole generated by the impact ionization with respect to the "0" cell and "1" cell when the bit line potential VBL is lower than the source line potential VSL.

FIG. 11 is a graph showing a contour of a rate of the hole generated by the impact ionization with respect to the "0" cell and "1" cell when the bit line potential VBL is lower than the source line potential VSL. The lines L1 to L6 of FIG. 11 are identical to those of FIG. 12. The lines L1 to L4 of FIG. 11 are identical to those of FIG. 4 or 5. However, in FIG. 11, the source line potential VSL is set to an origin for the purpose of easy understanding.

The region on the right side of the line L2 indicates the liner region of the "0" cell. A region between the line L1 and the line L2 indicates the saturated region of the "0" cell, and an upper left region of the line L1 indicates the weak inversion region. A region on the right side of the line L4 indicates the liner region of the "1" cell. A region between the line L4 and the line L3 indicates the saturated region of the "1" cell, and an upper left region of the line L3 indicates the weak inversion region of the "1" cell.

For the "0" cell, the impact ionization is not generated in the liner region (VWL>VSL+Vth0) on the right side of the line L2. For the "1" cell, the impact ionization is not generated in the liner region (VWL>VSL+Vth1) on the right side of the line L4. It should be noted that the rate of the hole generated by the impact ionization of the "1" cell is larger than that of the "0" cell in the region (VWL≦VSL+Vth1) on the left side of the line L4 and the upper left region (VBL≧VWL−Vth0) of the line L1. In other words, the impact ionization current Ii/i(1) in the "1" cell becomes larger than the impact ionization current Ii/i(0) in the "0" cell by satisfying the VWL≦VSL+Vth1 and VBL≧VWL−Vth0.

It is necessary that the word line potential VWL be equal to or larger than the bit line potential VBL (VWL≧VBL). The word line potential VWL is equal to or larger than the bit line potential VBL, which allows the potential at the body 50 to be surely equal to or higher than the potential at the drain 40. Therefore, the forward bias is applied to the pn junction between the body and the drain to draw the holes in the body 50 to the drain 40. Additionally, it is necessary that the word line potential VWL in the refresh be larger than the word line potential VWLL during the data retention.

The above-described conditions are expressed by a formula 5 to a formula 8.

$$VBL<VSL \qquad \text{(formula 5)}$$

$$VWL-VSL<=Vth1 \qquad \text{(formula 6)}$$

$$VWL>VBL>=VWL-Vth0 \qquad \text{(formula 7)}$$

$$VWL>VWLL \qquad \text{(formula 8)}$$

In order to perform the autonomous refresh, the word line potential VWL and the bit line potential VBL are set so as to satisfy the formula 5 to formula 8, even if the bit line potential VBL is smaller than the source potential VSL.

Figure 12:
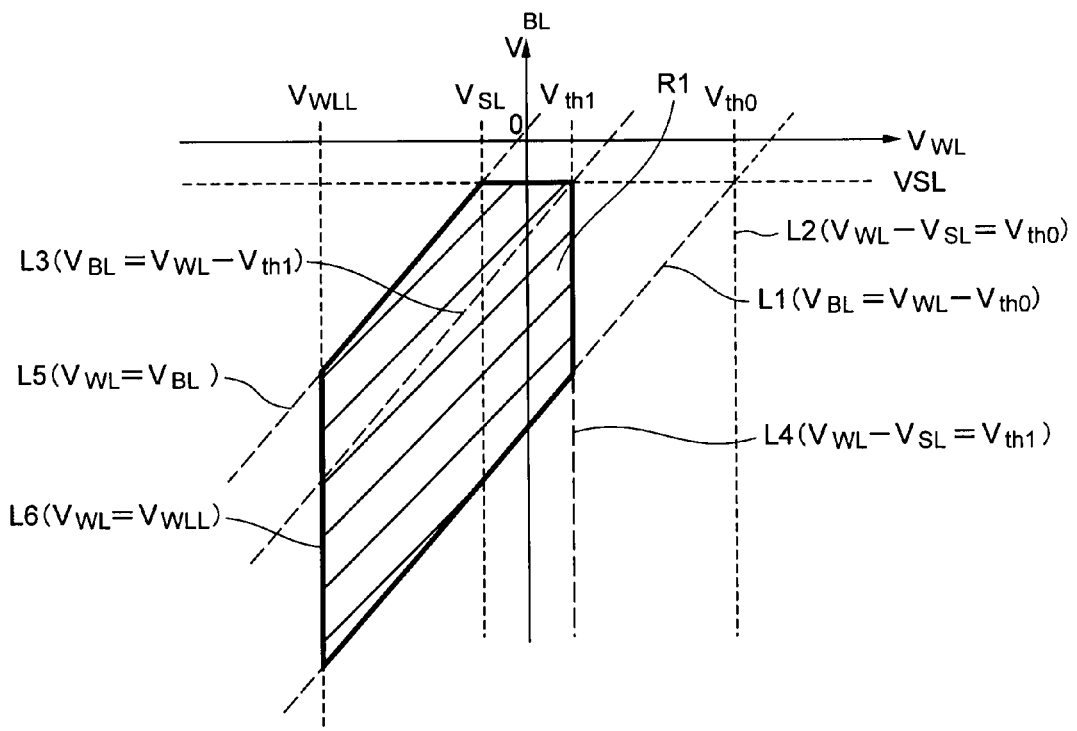
FIG. 12 is a graph showing ranges of the word line potential VWL and bit line potential VBL, in which the autonomous refresh can be performed in Case 2.

FIG. 12 is a graph showing ranges of the word line potential VWL and bit line potential VBL, in which the autonomous refresh can be performed in Case 2. In FIG. 12, the formula 5 to formula 8 are indicated by a range R1 shown by oblique lines with a heavy-line boundary. The autonomous refresh can be realized by equally applying one of the word line potential VWL and bit line potential VBL within the range R1 to the "0" cell and "1" cell.

Figure 13:
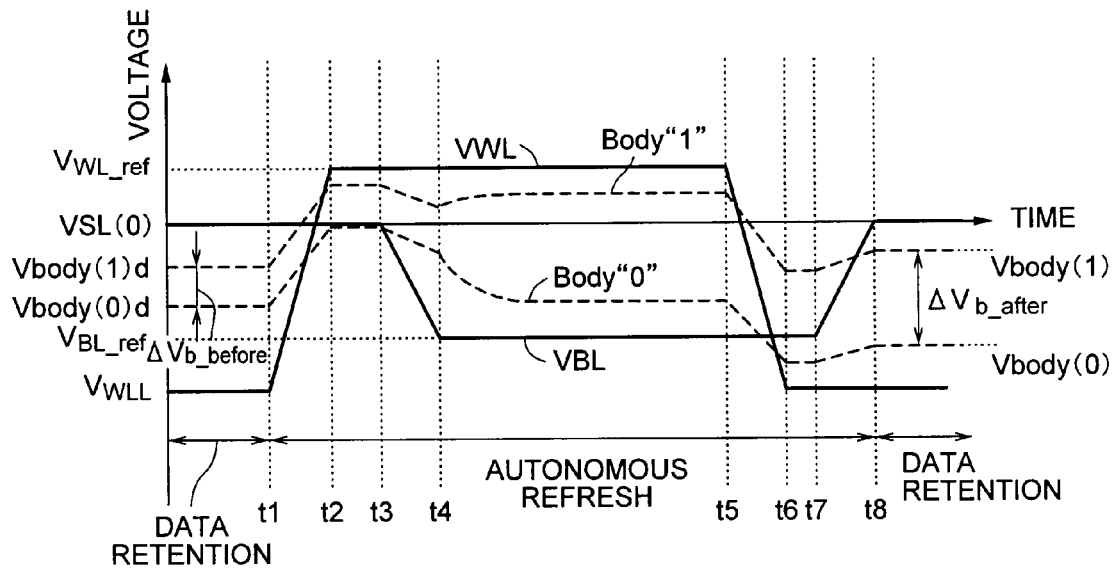
FIG. 13 is a timing chart showing an operation performed by the FBC memory in Case 2.

FIG. 13 is a timing chart showing an operation performed by the FBC memory in Case 2. In FIG. 13, the source line potential VSL is set to the ground potential (0V). First the data "1" or data "0" is written in each memory cell MC in the memory cell array MCA. In the data retention state (0 to t1), the word line potential VWL is set to the negative potential VWLL such that the reverse bias is applied to the pn junction between the body and the source and the pn junction between the body and the drain. At this point, the bit line potential VBL and the source line potential VSL are higher than the word line potential VWLL. For example, in FIG. 13, the bit line potential VBL and the source line potential VSL are set to the ground potential. Therefore, the leakage currents passed through the pn junction between the body and the source and the pn junction between the body and the drain are suppressed to lengthen the data retention time.

When a transition is made from the data retention state to the refresh operation (t1 to t2), the word line potential VWL rises up from the level VWLL in the data retention to VWL_ref which is higher than the level VWLL. VWL_ref is a potential higher than the bit line potential VBL. Then, in t3 to t4, the bit line potential VBL falls from the level (VSL=0) in the data retention to VBL_ref which is lower than the level (VSL=0). When the bit line potential VBL falls to the potential lower than the source line potential VSL (ground potential), the impact ionization is generated in the pn junction portion between the body and the drain and the forward bias is applied to the pn junction between the body and the source. In t4 to t5, the word line potential VWL_ref and the bit line potential VBL_ref are potentials satisfying the formula 5 to formula 8, and the autonomous refresh is performed in this period.

When the word line potential VWL and the bit line potential VBL are set to VWL_ref and VBL_ref, although the body potentials at the "0" cell and "1" cell are lowered by the capacity coupling between the body and the drain, the body potentials at the "0" cell and "1" cell are kept higher than the bit line potential VBL_ref by the capacity coupling between the body and the gate. Because the body potential at the "1" cell is originally higher than the body potential at the "0" cell, the body potential at the "1" cell is kept higher than the body potential at the "0" cell in the beginning of the rising of the word line potential VWL and the falling of the bit line potential VBL. The threshold voltage difference between the "0" cell and "1" cell is generated by the potential difference ΔVb_before. Accordingly, as described above with reference to FIG. 6, although the equal bit line potential and the equal word line potential are applied to the "0" cell and "1" cell, the "0" cell differs from the "1" cell in the impact ionization current Ii/i and the forward current Ifwd.

In the "1" cell, the high potential can be maintained because the impact ionization current Ii/i is larger than the forward current Ifwd. In the "0" cell, the body potential is lowered because the forward current Ifwd is larger than the impact ionization current Ii/i. Therefore, the body potential difference between the "1" cell and "0" cell is amplified.

Then, in t5 to t6, the word line potential VWL falls to the negative potential level in the data retention. In t7 to t8, the bit line potential VBL rises to the ground level in the data retention. Therefore, the autonomous refresh operation is completed and the memory becomes the data retention state again.

As is clear from FIG. 13, the body potential difference ΔVb_after between the "0" cell and "1" cell after the autonomous refresh is amplified larger than the body potential difference ΔVb_before between the "0" cell and "1" cell before the autonomous refresh operation.

Figure 14:
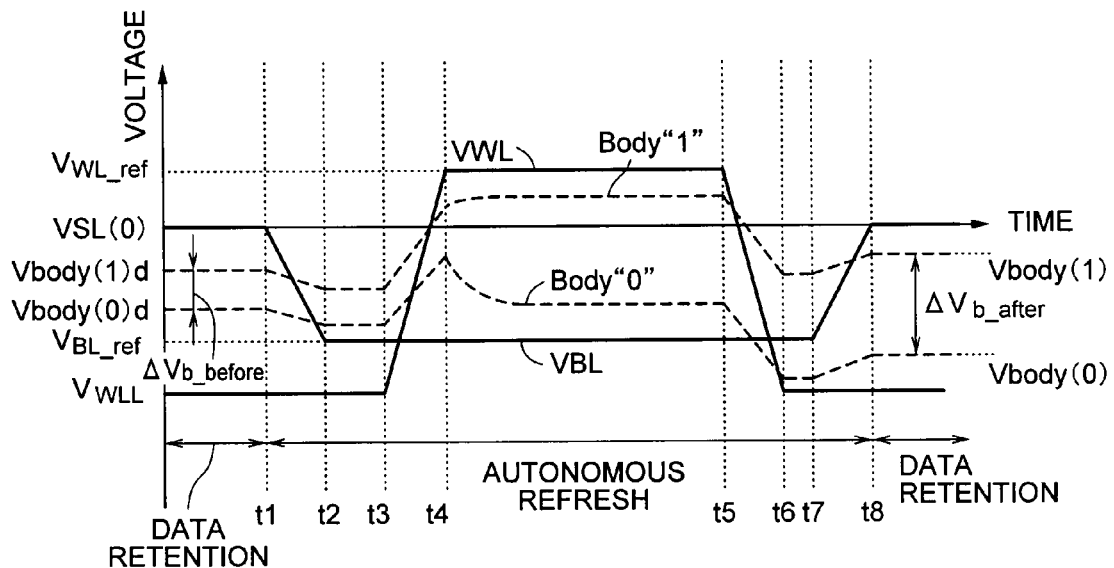
FIG. 14 is a timing chart showing another operation performed by the FBC memory of Case 2.

FIG. 14 is a timing chart showing another operation performed by the FBC memory of Case 2. The operation of FIG. 14 has the opposite rising procedures (t1 to t4) of the word line potential VWL and bit line potential VBL to those of FIG. 13. Other procedures in the operation of FIG. 14 are similar to those of FIG. 13. As shown in FIG. 14, even if the rising procedures of the word line potential VWL and bit line potential VBL are opposite to those of FIG. 13, the autonomous refresh can be performed like the operation of FIG. 13.

Figure 15:
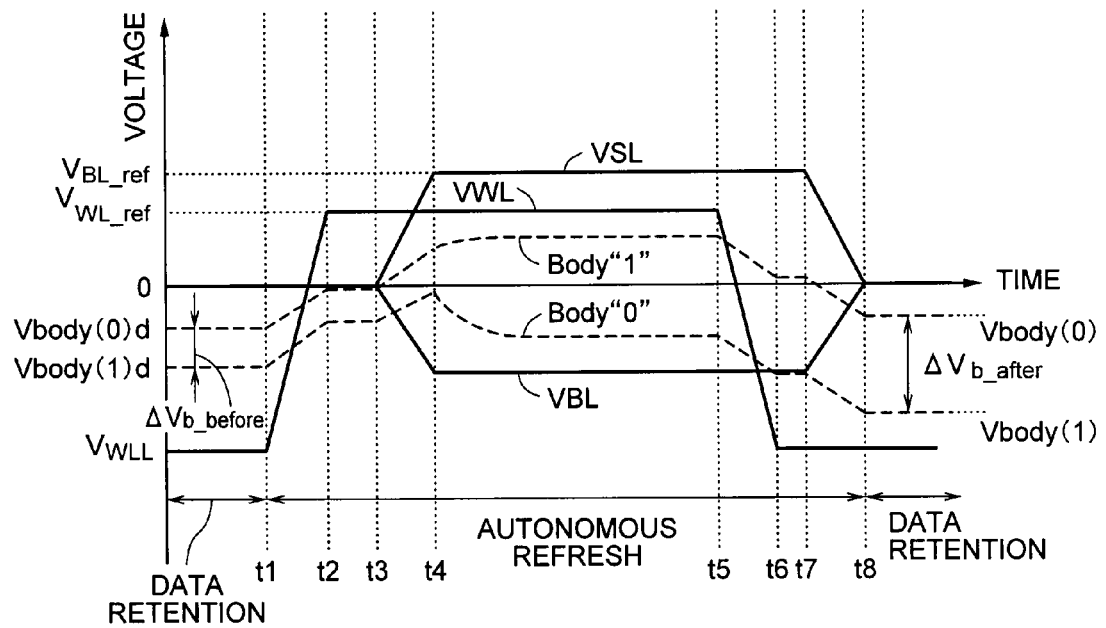
FIG. 15 is a timing chart showing still another operation performed by the FBC memory of Case 2.

FIG. 15 is a timing chart showing still another operation performed by the FBC memory of Case 2. In the operation of FIG. 15, during the autonomous refresh, the source line potential VSL is set to a positive potential higher than a level in the data retention state. At this point, the word line potential VWL rises up to the potential VWL_ref higher than the bit line potential VBL, and the bit line potential VBL falls to the potential VBL_ref lower than the ground potential.

Thus, the source line potential VSL is caused to change during the autonomous refresh, which allows the forward current between the body and the drain to be increased. Other procedures in the autonomous refresh operation of FIG. 15 are similar to those of FIG. 13.

Figure 16:
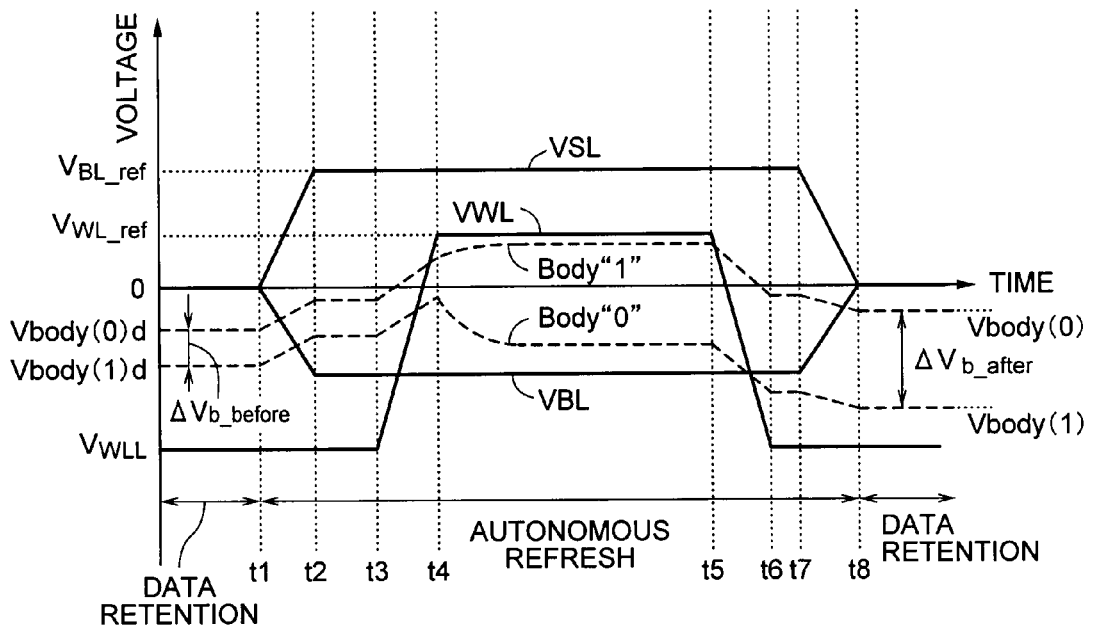
FIG. 16 is a timing chart showing still another operation performed by the FBC memory of Case 2.

FIG. 16 is a timing chart showing still another operation performed by the FBC memory of Case 2. The operation of FIG. 16 has the opposite rising procedures (t1 to t4) of the word line potential VWL and bit line potential VBL to those of FIG. 15. Other procedures in the operation of FIG. 16 are similar to those of FIG. 15. As shown in FIG. 16, even if the rising procedures of the word line potential VWL and bit line potential VBL are opposite to those of FIG. 15, the autonomous refresh can be performed like the operation of FIG. 15.

Figure 17:
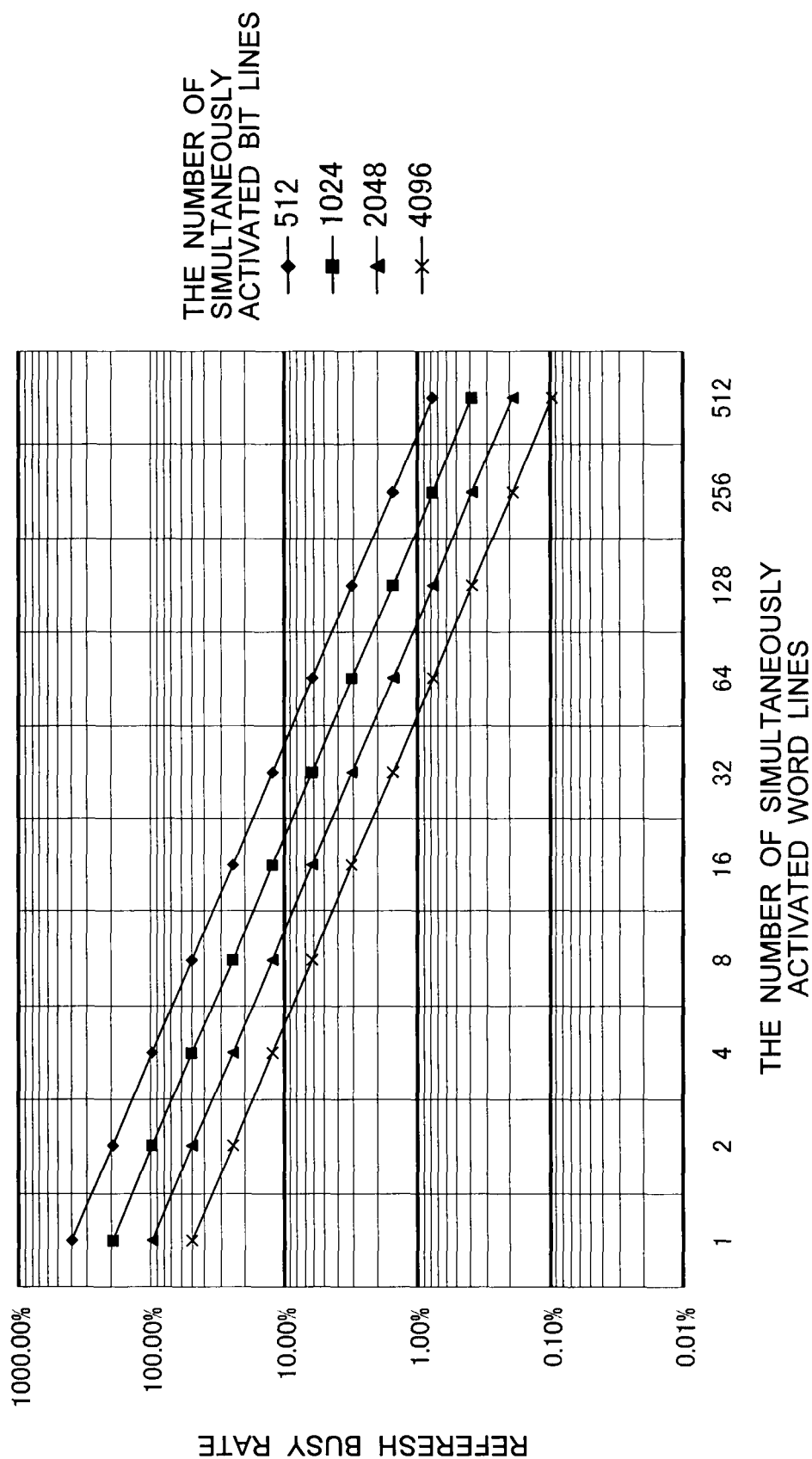
FIGS. 17 and 18 show results with a 1-gigabit FBC memory including 32-by-16 units (2 Mb×32×16) of two-megabit memory cell arrays MCA.
Figure 18:
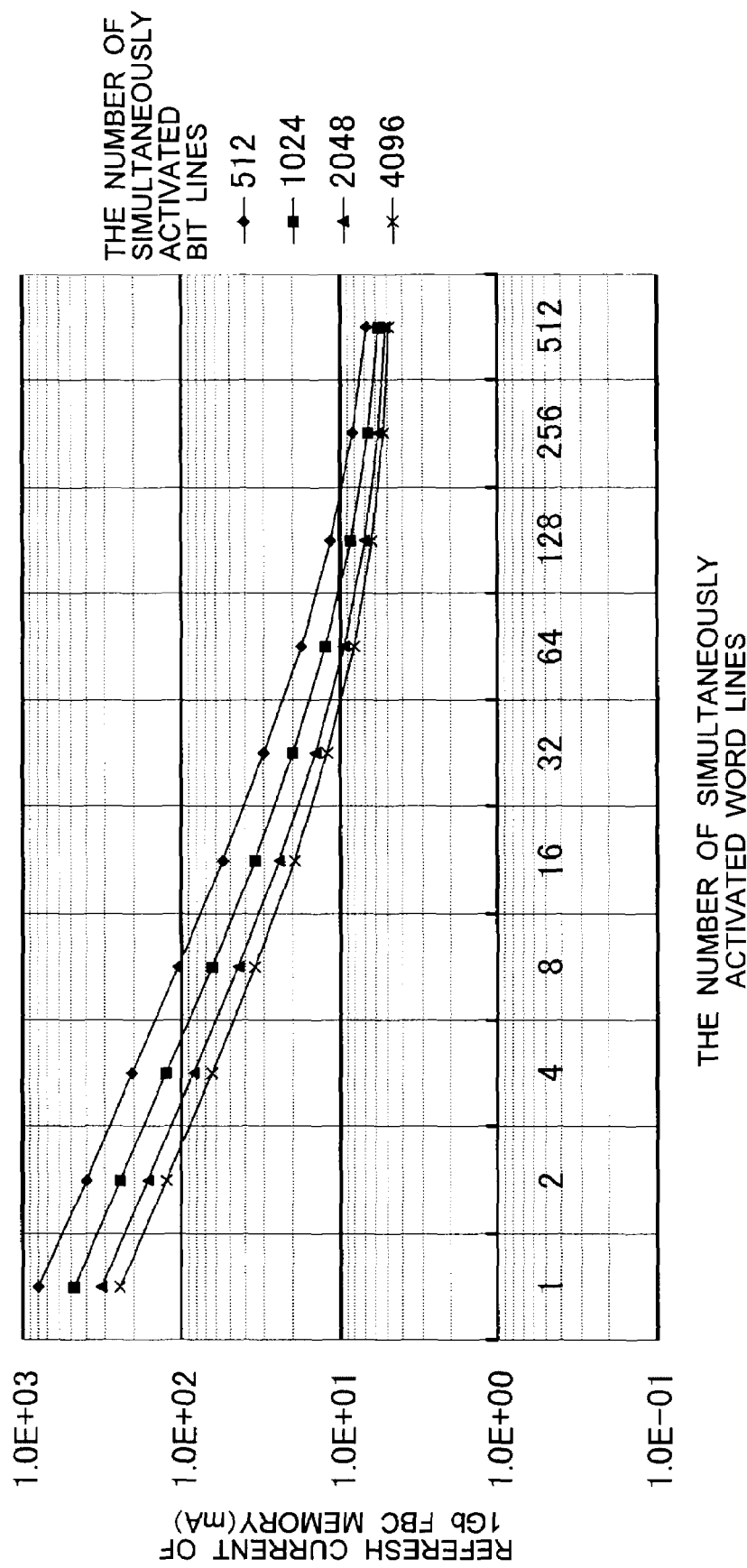

An effect of autonomous refresh of the first embodiment will be described with reference to FIGS. 17 and 18. FIGS. 17 and 18 show results with a 1-gigabit FBC memory including 32-by-16 units (2Mb×32×16) of two-megabit memory cell arrays MCA. For example, the two-megabit memory cell array MCA includes 512 word lines WL and 4096 bit lines BL. The autonomous refresh time is set to one millisecond, the current passed through the "1" cell during the refresh is set to 0.2 µA, the current passed through the "0" cell during the refresh is substantially set to zero, the refresh time is set to 20 nanoseconds, and the refresh cycle time is set to 60 nanoseconds.

FIG. 17 is a graph showing a relationship between the number of simultaneously activated word lines WL and a refresh busy rate. A horizontal axis indicates the number of word lines WL simultaneously activated during the refresh and a vertical axis indicates the refresh busy rate. The refresh busy rate shall mean a temporal rate occupied by the refresh operation. For example, the refresh busy rate of 100% is a state in which the refresh operation is always required. Accordingly, the lower refresh busy rate is better as long as the data can be retained.

In the case where the number of simultaneously activated word lines WL is one in the refresh operation, the refresh busy rate becomes about 50% even if the bit lines BL (4096 lines) of all the columns are simultaneously activated.

In the conventional refresh operation, the sense amplifier tentatively reads the data from the memory cell, and the sense amplifier writes the data in the same memory cell again. Accordingly, it is necessary that the one word line WL be activated during the refresh, and it is also necessary to provide the sense amplifier corresponding to each bit line or each bit line pair. In this case, the refresh busy rate cannot be decreased below about 50% even if the bit lines BL (4096 lines) of all the columns are simultaneously activated.

In the autonomous refresh operation of the first embodiment, the difference in body potential between the "1" cell and the "0" cell is utilized to autonomously refresh the data "1" and the data "0", which eliminates the read operation and write operation using the sense amplifier S/A. Accordingly, the plural word lines can simultaneously be activated during the refresh. That is, the refresh operation can simultaneously be performed to plural memory cells MC connected to a certain bit line BL. For example, the refresh busy rate can be decreased to about 0.1% in the case where the 512 word lines WL and the 4096 bit lines BL are simultaneously activated in the refresh operation (all the memory cells in one memory cell array are simultaneously refreshed).

FIG. 18 is a graph showing a relationship between the number of simultaneously activated word lines WL and a refresh current. A horizontal axis indicates the number of word lines WL simultaneously activated during the refresh and a vertical axis indicates the refresh current of a one-gigabit FBC memory. The refresh current shall mean a current necessary to refresh the memory cells MC of the whole of the FBC memory.

In the case where the number of simultaneously activated word lines WL is one in the refresh operation (conventional refresh operation), the refresh current of about 250 mA is required even if the bit lines BL (4096 lines) of all the columns are simultaneously activated.

The refresh current becomes about 5 mA in the case where the 512 word lines WL and the 4096 bit lines BL are simultaneously activated in the refresh operation (autonomous refresh operation of the first embodiment).

The refresh busy rate of about 0.1% and the refresh current of about 5 mA are obtained in the case where the memory cells of the whole of the memory cell array are simultaneously refreshed using the autonomous refresh operation of the first embodiment. Thus, in the autonomous refresh of the first embodiment, even if the memory cell MC has the same data retention time as that of the conventional memory cell, a frequency of the refresh operation and the consumption current can be decreased compared with the conventional technique.

In the autonomous refresh operation of the first embodiment, the memory cells MC of the whole of the memory cell array are simultaneously refreshed. Alternatively, the memory cell array is divided into blocks and the memory cells MC may simultaneously be refreshed in each block. Further, a plurality of the word lines in the memory cell array can be simultaneously selected, and the memory cell array connected the plurality of the word lines can be simultaneously refreshed.

Obviously, similarly to the conventional technique, the word lines WL are activated one by one in the order of address during the refresh, and the memory cells MC connected to the bit lines BL of all the columns corresponding to the activated word line WL may be refreshed. In this case, the same refresh current as the conventional technique is required. Alternatively, the bit lines BL are activated one by one in the order of address during the refresh, and the memory cells MC connected to the word lines WL of all the rows corresponding to the activated bit line BL may be refreshed.

Preferably the memory cells of the whole of the memory cell array are simultaneously refreshed in consideration of refresh efficiency. The autonomous refresh can realize the simultaneous refresh of the memory cells of the whole of the memory cell array. For example, it is assumed that N-by-M bit memory array includes N word lines and M bit lines. Assuming that Tret is a minimum retention time of all the memory cells, it is necessary that M bit lines be charged and discharged in each time of Tret/N in the same refresh operation as the conventional DRAM. Assuming that CWL and VWL are a capacity of the word line and a voltage amplitude and CBL and VBL are a capacity of the bit line and a voltage amplitude, a current Iret1 necessary to retain the data of the whole of the memory cell array is expressed by formula 9.

$$\text{Iret1} = (CWL*VWL + M*CBL*VBL)/(Tret/N) = N* (CWL*VWL + M*CBL*VBL)/Tret \quad \text{(formula 9)}$$

On the other hand, in the case where all the memory cells are simultaneously refreshed, all the word lines WL and all the bit lines BL are activated in each elapsed time of Tret. Accordingly, a current Iret2 necessary to retain the data of the memory cell array is expressed by formula 10.

$$\text{Iret2} = (N*CWL*VWL + M*CBL*VBL)/Tret \quad \text{(formula 10)}$$

A difference $\Delta\text{Iret} = \text{Iret1} - \text{Iret2}$ of the data retention current is expressed by formula 11.

$$\Delta\text{Iret} = (N-1)M*CBL*VBL/Tret \approx (N*M)*CBL*VBL/Tret \quad \text{(formula 11)}$$

The difference of the data retention current is substantially equal to the charge and discharge current of the bit line in the conventional refresh operation. Because of $N*CWL*VWL \ll (N*M)*CBL*VBL$, the data retention current in the autonomous refresh of the first embodiment is vanishingly small compared with the data retention current in the conventional refresh.

For the consumption current in the peripheral circuit, in the conventional refresh, it is necessary that the peripheral circuit be charged and discharged N times during Tret. However, in the autonomous refresh of the first embodiment, it is sufficient that the peripheral circuit be charged and discharged only once during Tret. For the peripheral circuit, the consumption current in the autonomous refresh of the first embodiment is vanishingly small compared with the consumption current in the conventional refresh. An influence of a DC current passed through the memory cell during the refresh is neglected in the computation.

Second Embodiment

Figure 19:
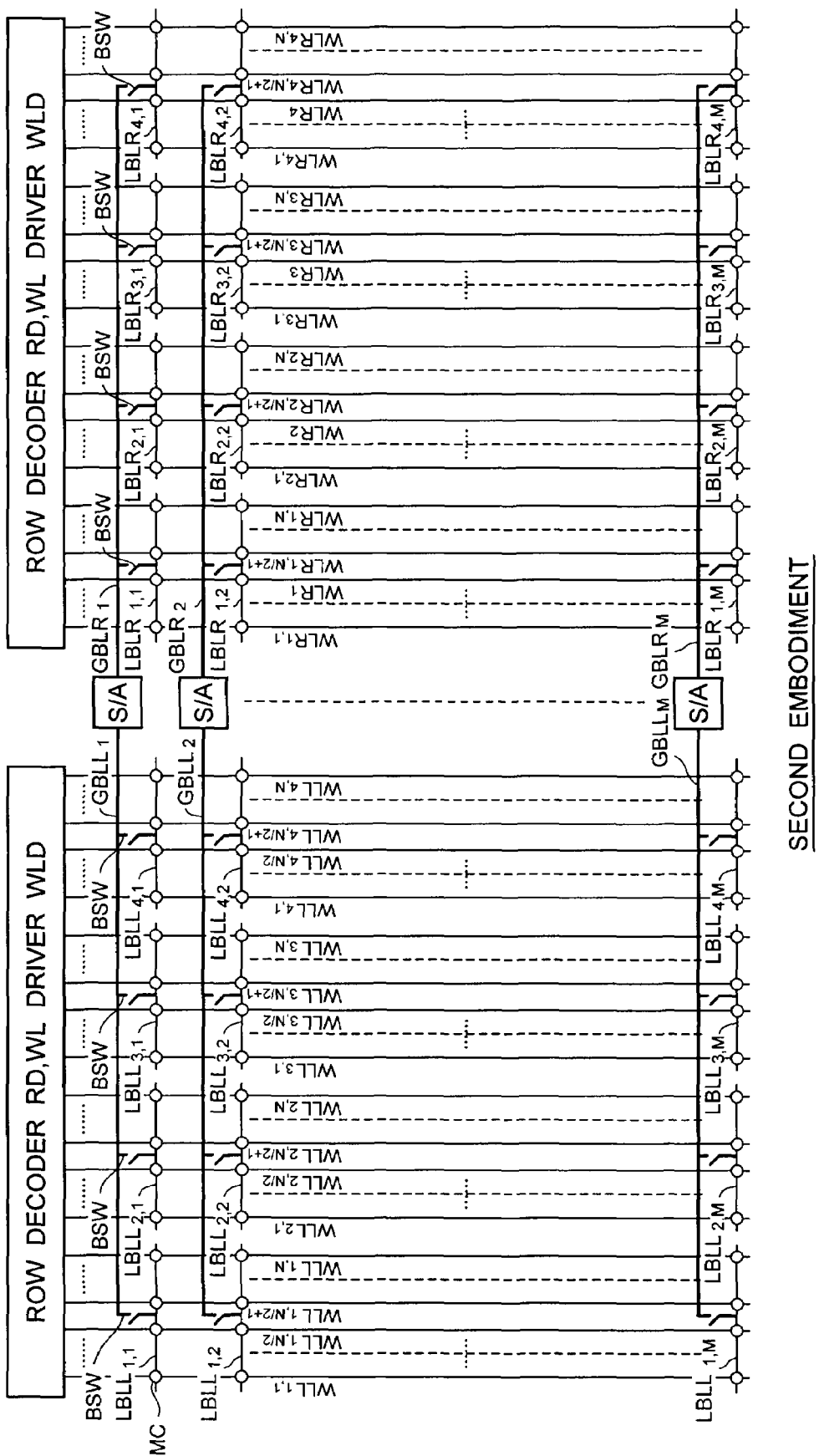
FIG. 19 shows an example of a configuration of an FBC memory according to a second embodiment of the invention.

FIG. 19 shows an example of a configuration of an FBC memory according to a second embodiment of the invention. In the second embodiment, the bit line is divided into local bit lines LBLLk,i to LBLRk,i (k is 1 to N, i is 1 to M) (hereinafter also simply referred to as LBL) and global bit lines GBLLi to GBLRi (hereinafter also simply referred to as GBL). Each local bit line LBL is connected to some memory cells MC in the memory cells MC of a certain column. In FIG. 19, (N+1) memory cells MC are connected to one local bit line LBL. The global bit line GBL corresponding to the plural local bit lines is provided while connected to the sense amplifier S/A.

A bit line switch BSW is connected between the local bit line LBL and the global bit line GBL. The global bit line GBL can selectively be connected to a specified local bit line LBL by the bit line switch BSW.

In the hierarchical bit-line configuration shown in FIG. 19, it is not necessary that the sense amplifier S/A be provided in each local bit line LBL, so that the number of sense amplifiers S/A can be decreased. For example, in a specific example of FIG. 19, the global bit lines GBL are connected on both sides of the sense amplifier S/A, and each global bit line GBL is connected to four local bit lines LBL (total of eight local bit lines). Therefore, in the second embodiment, the number of sense amplifiers S/A becomes one-eighth compared with the case in which the sense amplifier S/A is provided in each local bit line LBL.

In the hierarchical bit-line configuration, the number of memory cells which can be refreshed once is decreased to one-eighth when the conventional refresh operation is performed. Therefore, the number of refresh cycles (the number of refresh cycles necessary to refresh all the memory cells) is increased and the refresh busy rate is increased.

On the contrary, in the case of the use of the autonomous refresh according to the present embodiments, the memory cells of the whole of the memory cell array can simultaneously be refreshed irrespective of the number of sense amplifiers. Therefore, according to the autonomous refresh of the second embodiment, even in the FBC memory in which the hierarchical bit-line configuration is adopted, all the memory cells can be refreshed without increasing the refresh busy rate. The number of sense amplifiers S/A is decreased by adopting the hierarchical bit-line configuration, so that the chip size of the whole of the memory device can be reduced.

Third Embodiment

Figure 20:
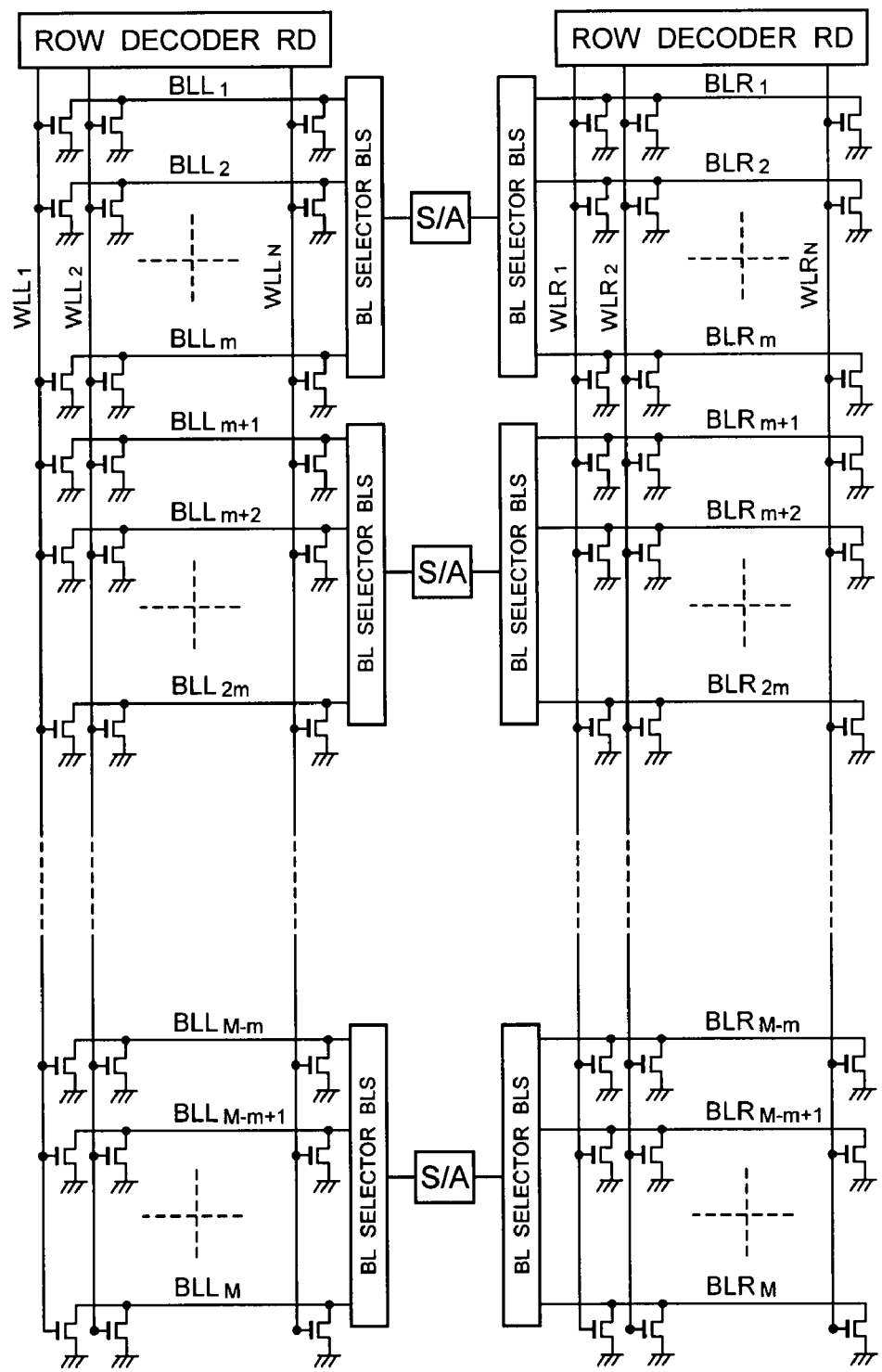
FIG. 20 shows an example of a configuration of an FBC memory according to a third embodiment of the invention.

FIG. 20 shows an example of a configuration of an FBC memory according to a third embodiment of the invention. The third embodiment differs from the first embodiment in that a bit line selector BLS is provided between the sense amplifier S/A and plural bit lines BL. In the data read operation or data write operation, the bit line selector BLS selects one bit line from the plural bit lines to connect the selected bit line to the sense amplifier S/A. In the autonomous refresh operation, the bit line selector BLS selects all or a part of the plural bit lines to connect the selected bit line to the sense amplifier S/A.

The bit line selector BLS corresponding to the (m+1) bit lines BL is provided in the specific example of FIG. 20. Therefore, the sense amplifier S/A is also provided so as to correspond to the (m+1) bit lines BL. In the third embodiment, similarly to the first and second embodiments, the autonomous refresh can simultaneously be performed to all the memory cells in the memory cell array MCA irrespective of the number of sense amplifiers S/A. Additionally, the sense amplifier S/A is provided in each (m+1) bit lines BL, so that the number of sense amplifiers S/A can be decreased. Accordingly, the chip size of the whole of the memory device can be reduced.

Fourth Embodiment

Figure 21:
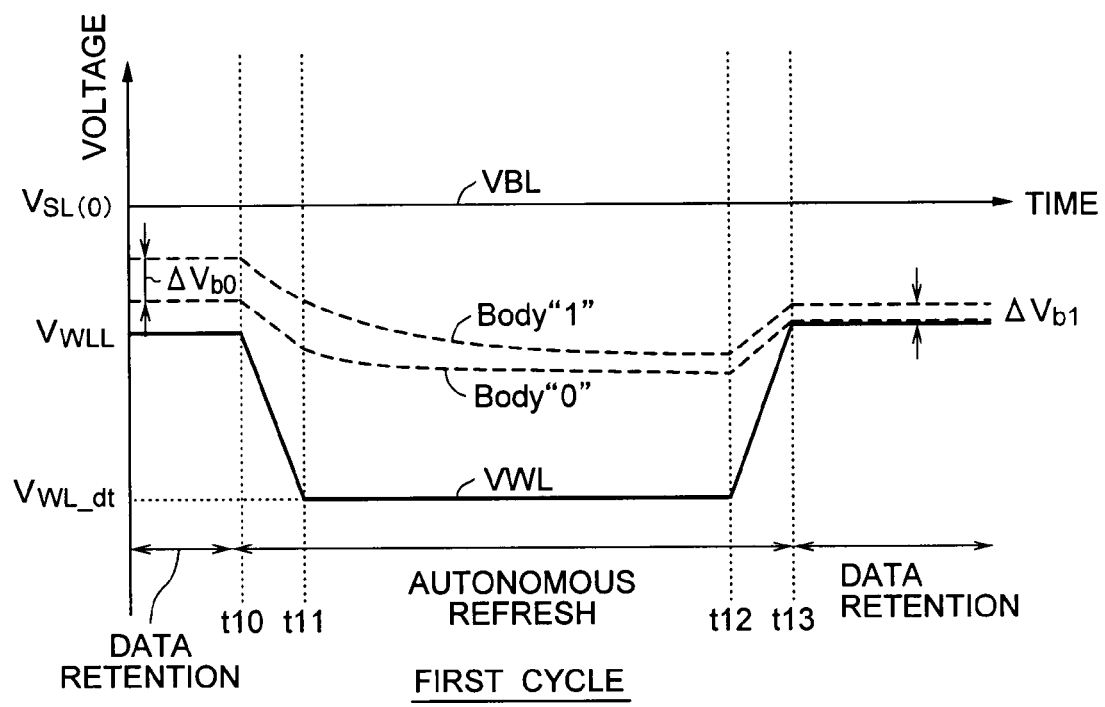
FIGS. 21 and 22 show timing charts of a fourth embodiment.
Figure 22:
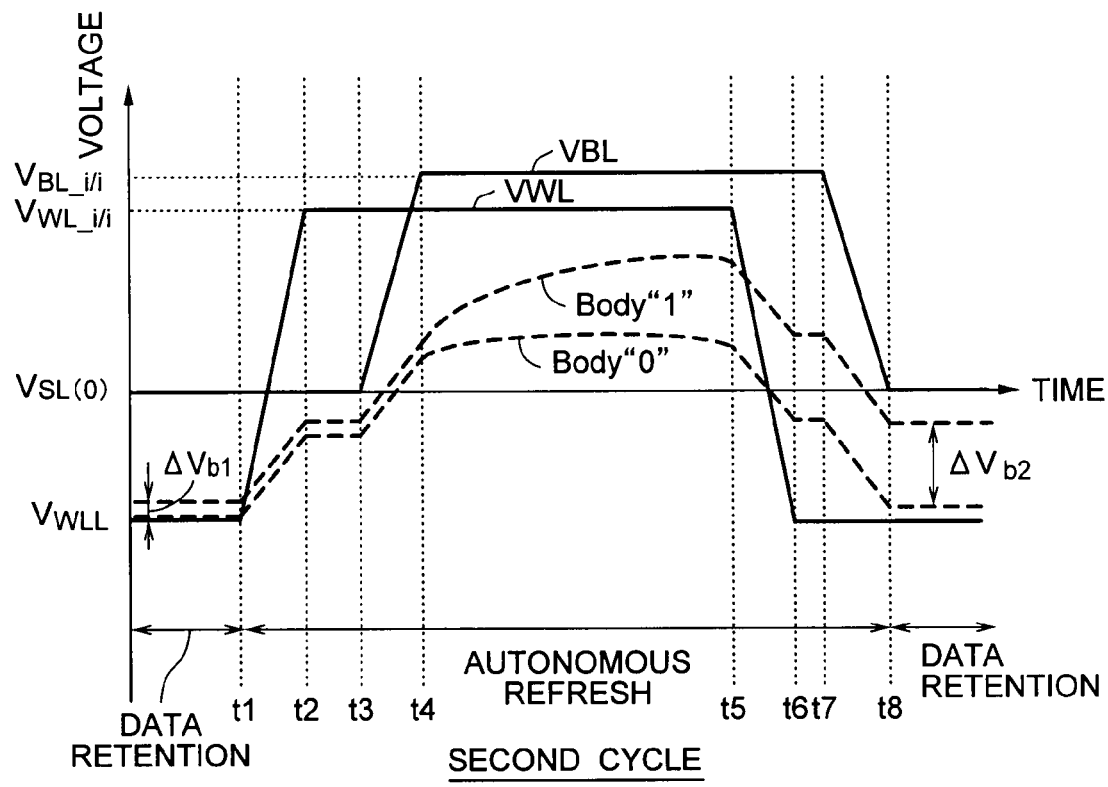

As shown in FIGS. 21 and 22, a fourth embodiment includes a first cycle and a second cycle. In the first cycle, while the bit line potential is kept at VSL like the source line potential, the word line potential VWL is decreased to a negative value of VWL_dt. This enables a direct tunneling phenomenon to cause the electrons to flow into the body 50 from a gate electrode (word line WL) through a gate dielectric film. Alternatively, the holes in the body 50 are drawn to the gate by the direct tunneling phenomenon. The direct tunneling phenomenon is a current generated between the gate and the body by thinning the gate dielectric film to an extent. In the second cycle, the potential at the word line is raised to a level VWL_i/i, and the potential at the bit line is raised to a level VBL_i/i. Therefore, the impact ionization is generated to cause the holes to flow into the body 50.

A relationship between the body potential Vbody and a current I passed from or into the body 50 in each of the first and second cycles will be described below.

During performing the first cycle of FIG. 21, the electrons flow from the gate electrode into body 50 to recombine the holes or the holes flow out from the body 50 by the direct tunneling phenomenon of the gate dielectric film. It is assumed that Idt is a current passed by the direct tunneling phenomenon. It is assumed that Ipn is a diode current passed through the pn junction portion between the body and the source or the pn junction portion between the body and the drain. The tunneling current Idt and the diode current Ipn are shown by a graph of FIG. 23. The sum (Idt+Ipn) of the tunneling current and the diode current determines the outflow current of the holes.

It is assumed that Ii/i is a current of the holes generated by the impact ionization during performing the second cycle of FIG. 22 and Ipn is a diode current of the pn junction portion between the body and the source. The impact ionization current Ii/i and the diode current Ipn are shown by a graph of FIG. 24. A difference (Ii/i−Ipn) between the impact ionization current Ii/i and the diode current Ipn determines the inflow current of the holes.

Figure 23:
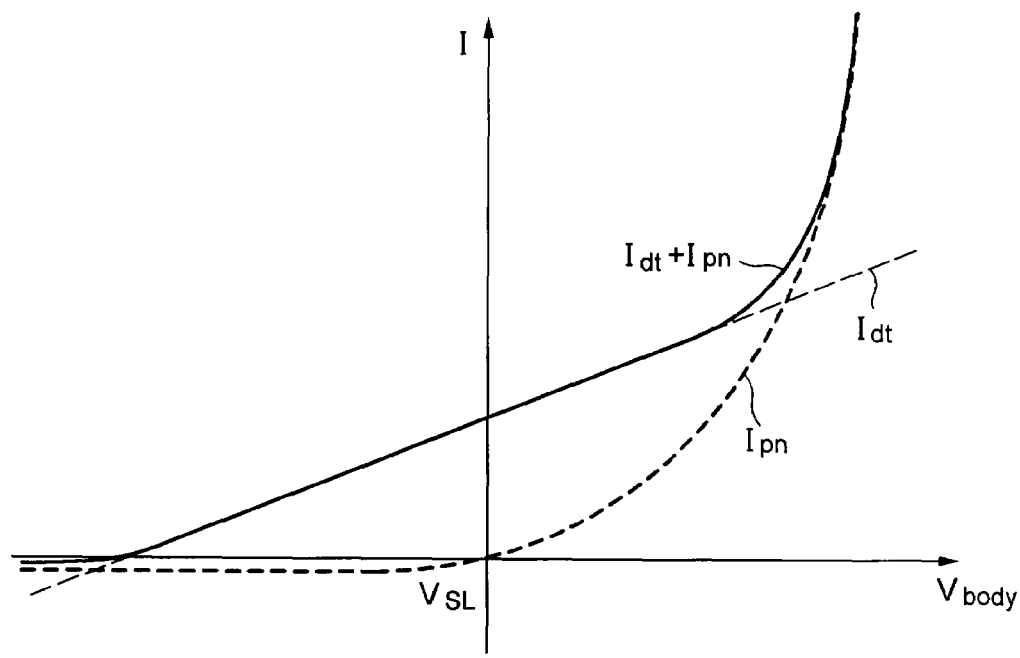
FIG. 23 is a graph showing the tunneling current Idt and the diode current Ipn.
Figure 24:
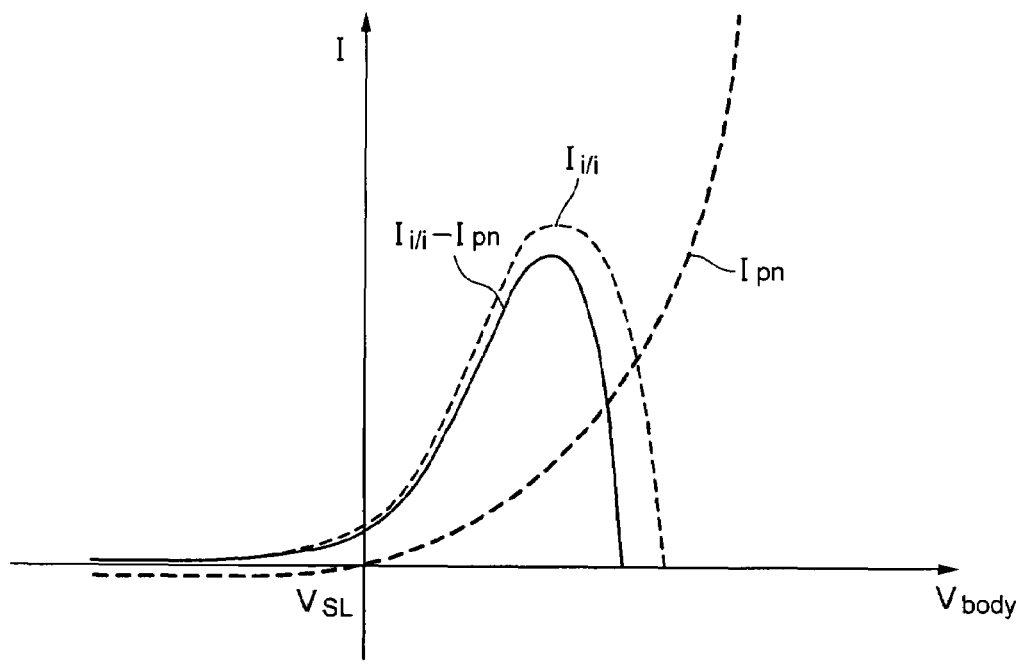
FIG. 24 is a graph showing the impact ionization current Ii/i and the diode current Ipn.
Figure 25:
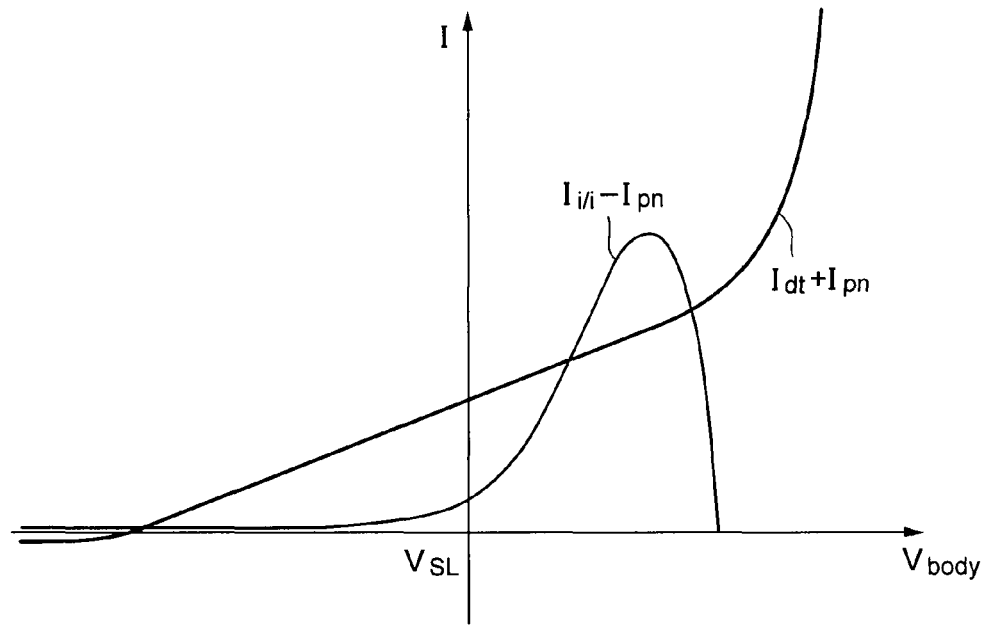
FIGS. 25 and 26 are graphs showing curve (Idt+Ipn) of FIG. 23 and curve (Ii/i−Ipn) of FIG. 24 on the same axes.

FIG. 25 is a graph showing curve (Idt+Ipn) of FIG. 23 and curve (Ii/i−Ipn) of FIG. 24 on the same axes. Because the first cycle of FIG. 21 differs from the second cycle of FIG. 22 in the word line potential VWL and bit line potential VBL, a difference in body potential is generated between the first cycle and the second cycle. The difference in body potential is attributed to the difference between the coupling capacity of the body and the drain and the coupling capacity of the body and the gate. For example, the word line potential VWL has a negative value in the end (t13) of the first cycle as shown in FIG. 21, while the word line potential VWL is changed to a positive value in the beginning (t4) of the second cycle as shown in FIG. 22. The bit line potential VBL has the source line potential VSL in the end (t13) of the first cycle, the bit line potential VBL is changed to a positive value in the beginning (t4) of the second cycle. Therefore, the body potential changes by the transition from the first cycle to the second cycle. It is assumed that ΔVbody is the component of the body potential change. When characteristics of the autonomous refresh in the steady state is analyzed (DC analysis), it is necessary that a current curve of Idt+IPn of FIG. 25 be translated in the positive direction of Vbody by ΔVbody. Assuming that Idt+Ipn (Vbody−ΔVbody) is the current curve of Idt+Ipn after the translation, the curve of Idt+Ipn (Vbody−ΔVb) is expressed as shown in FIG. 26.

The intersection of the curve Idt+Ipn (Vbody−ΔVb) and the curve Ii/i−Ipn becomes stable equilibrium positions SEP10 and SEP12 and an unstable equilibrium position USP10.

It is considered that the value of ΔVbody is a function of Vbody. Therefore, actually the curve of Idt+Ipn is not completely translated but slightly deformed. In this case, the deformation is neglected in the curve of Idt+Ipn.

Figure 26:
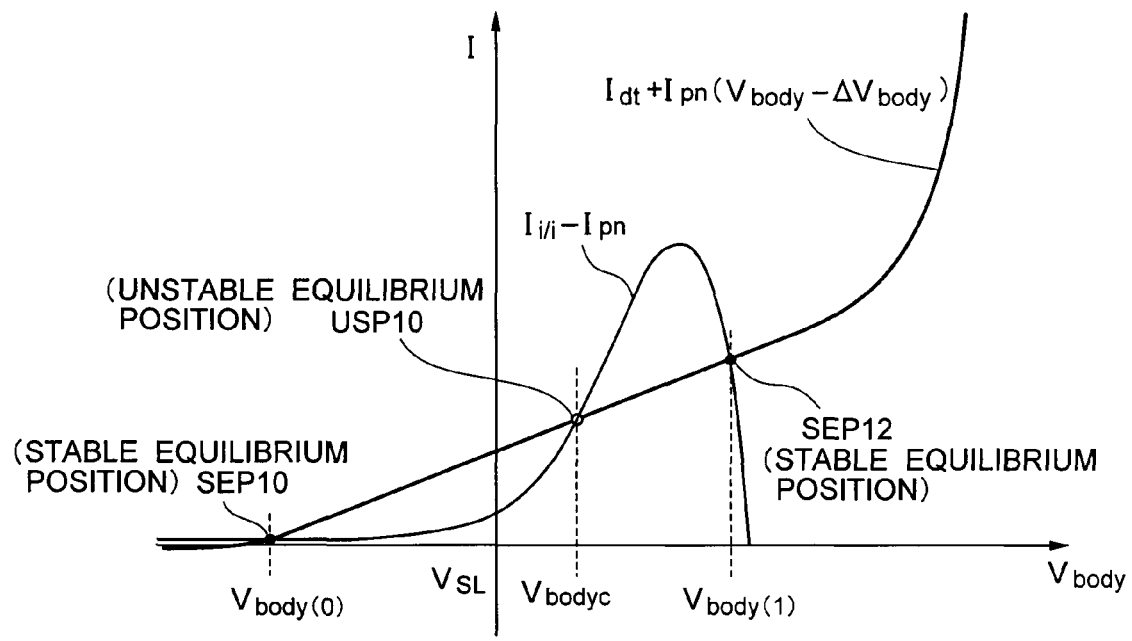

Thus, in FIG. 26, the two stable equilibrium positions SEP10 and SEP12 are generated on both sides of the unstable equilibrium position USP10. Assuming that Vbody(0) and Vbody(1) are body potentials at the stable equilibrium positions SEP10 and SEP12 respectively, the body potentials converge to Vbody(0) and Vbody(1) by the autonomous refresh.

In the fourth embodiment, sometimes the second cycle is preferably performed after the first cycle. The reason is described below. The second cycle acts so as to recover the "0" cell and "1" cell (increase the body potential difference). On the other hand, the first cycle acts so as to decrease the body potential difference between the "0" cell and the "1" cell. That is, the tunnel current Idt in the first cycle is increased with increasing the amount of holes accumulated in the memory cell. In the case where the sufficiently many holes are accumulated in the "1" cell, sometimes the body potential at the "1" cell is not raised by the second cycle, but only the body potential at the "0" cell is raised. In such cases, when the second cycle is performed prior to the first cycle, the body potential difference is possibly decreased in both the first and second cycles.

Accordingly, the holes are drawn from the memory cell MC by performing the first cycle. Then, the holes are accumulated in the "1" cell by performing the second cycle. That is, a sequence of the first and second cycles becomes important in the case where the sufficiently many holes are accumulated in the "1" cell.

Sometimes the memory cell is insufficiently recovered only by performing the first cycle and the second cycle once. In such cases, the first cycle and the second cycle may be performed plural times.

Figure 27:
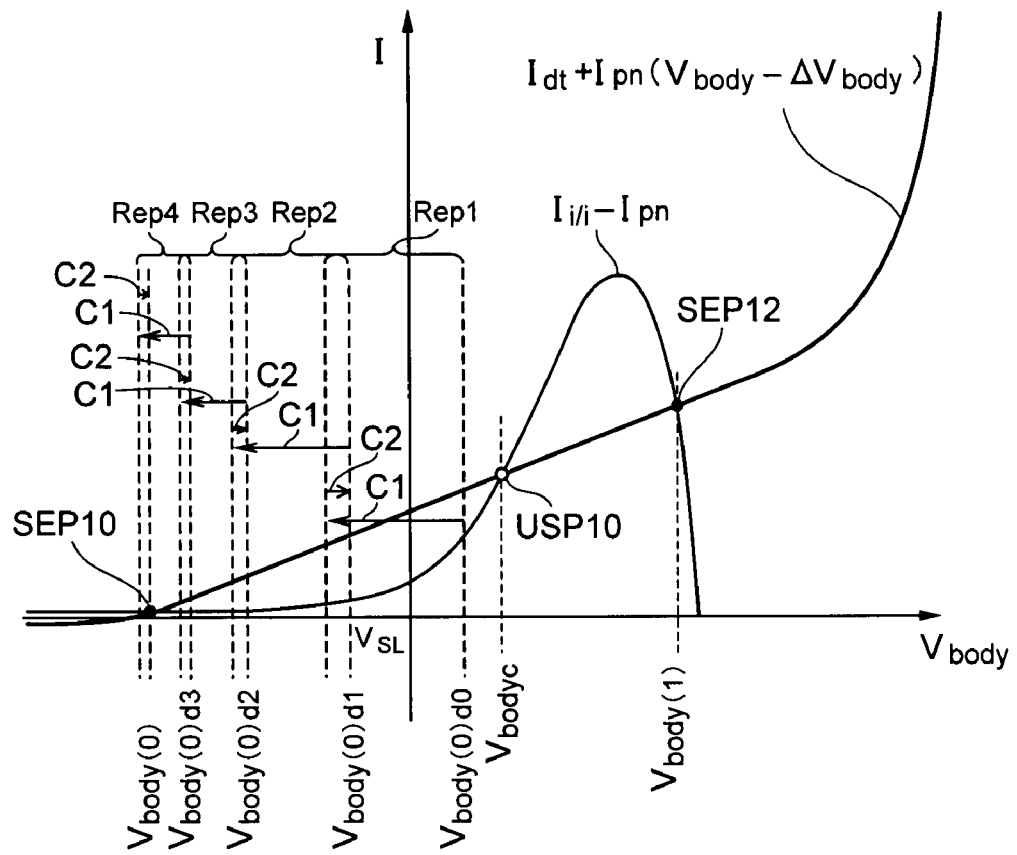
FIG. 27 is a conceptual view showing a change in body potential at the "0" cell when the first cycle C1 and the second cycle C2 are alternately repeated.

FIG. 27 is a conceptual view showing a change in body potential at the "0" cell when the first cycle C1 and the second cycle C2 are alternately repeated. In FIG. 27, the repetition of the first cycle C1 and second cycle C2 is shown as Rep1 to Rep4. In the repetitions Rep1 to Rep4, the first cycle C1 is performed, and then the second cycle C2 is performed, respectively.

The holes accumulated in the deteriorated "0" cell are discharged in the first cycle C1. At this point, the holes are also discharged from the "1" cell. Then, in the second cycle, the word line potential VWL and the bit line potential VBL are set such that the body potential at the "0" cell is smaller than Vbodyc while the body potential at the "1" cell is larger than Vbodyc. Therefore, the holes are not substantially accumulated in the "0" cell, but the holes are accumulated in the "1" cell.

When the repetitions Rep1 to Rep4 are performed, the holes can be replenished to the "1" cell while the holes are surely drawn from the "0" cell. As described above, drawing the holes from the "0" cell is important as the refresh function. In the fourth embodiment, the holes can surely be drawn from the "0" cell by performing the first cycle.

The second cycle of the fourth embodiment is similar to the first embodiment. That is, in the autonomous refresh of the fourth embodiment, the first cycle is added on at the beginning or end of the first embodiment. Therefore, the second cycle is performed under the same conditions as the first embodiment and the second cycle has the same modifications as the first embodiment. For example, one of the operations shown in FIGS. 8 to 10 and 13 to 16 may be performed instead of the operation of FIG. 22. Obviously, similarly to the first embodiment, the fourth embodiment can be applied to the second and third embodiments. Therefore, the fourth embodiment has the effect of one of the first to third embodiments.

It is not always necessary that the refresh time t12–t11 in the first cycle of FIG. 21 be identical to the refresh time t5–t4 in the second cycle of FIG. 23. For example, in the case of the small current of the gate direct tunneling, t12–t11=α(t5–t4) may hold (α>1). In the reverse case, α may be se set lower than 1. In the former case, the characteristics of the autonomous refresh can be discussed using the relationship between the curve of Ii/i–Ipn and the curve upwardly enlarged α times the curve of Idt+Ipn (Vbody–ΔVbody) in FIG. 26. In the extreme case, the word line potential is always set to the VWL_dt of FIG. 21 (VWL_dt=VWLL) during the data retention, and the second cycle of FIG. 22 can be performed in a short time in each refresh interval. That is, the first cycle is identical to the data retention state, and the first cycle does not become the cycle which should particularly be performed.

What is claimed is:

1. A method of driving a memory including memory cells, bit lines, and word lines, each memory cell having a source, a drain, and a floating body in an electrically floating state, the memory cells storing logical data according to the number of carriers in the floating bodies, the bit lines being connected to the drains, the word lines intersecting the bit lines, the method comprising:
performing a refresh operation for recovering deterioration of first logical data of the memory cells and deterioration of second logical data of the memory cells, the number of the carriers accumulated in the floating body of the memory cell storing the second logical data is smaller than that of the memory cell storing the first logical data, wherein in the refresh operation, the number of the carriers injected into the floating body is larger than the number of the carriers discharged from the floating body when a potential at the floating body is larger than a critical value, and the number of the carriers injected into the floating body is smaller than the number of the carriers discharged from the floating body when the potential at the floating body is smaller than the critical value.

2. The memory driving method according to claim 1, wherein the carriers injected into the floating body are generated by impact ionization, and the carriers are discharged from the floating body by a current of a forward bias in a pn junction portion between the floating body and the source of the memory cell or a pn junction portion between the floating body and the drain of the memory cell.

3. The memory driving method according to claim 1, wherein the carriers injected into the floating body are generated by impact ionization, and the carriers are discharged from the floating body by a direct tunneling current passed through a gate dielectric film of the memory cell.

4. The memory driving method according to claim 2, wherein the carriers injected into the floating body are generated by impact ionization, and simultaneously the carriers are discharged from the floating body by a current of a forward bias in a pn junction portion between the floating body and the source of the memory cell or a pn junction portion between the floating body and the drain of the memory cell.

5. The memory driving method according to claim 3, wherein an impact ionization current generated by the impact ionization and the direct tunneling current are alternately generated.

6. The memory driving method according to claim 1, further comprising sense amplifiers which are connected to the bit lines to read or write data from and in the memory cells, wherein the bit lines are connected to drains of the plurality of memory cells, the plurality of word lines are provided so as to correspond to the plurality of memory cells connected to one of the bit lines, and the refresh operation is simultaneously performed to the plurality of memory cells connected to the one of the bit lines.

7. The memory driving method according to claim 6, wherein the sense amplifiers do not perform a data read operation of the memory cells in the refresh operation.

8. A semiconductor storage device comprising:

memory cells, each of which has a source, a drain, and a floating body in an electrically floating state, the memory cells storing logical data according to the number of carriers in the floating bodies;

bit lines connected to the drains; and word lines intersecting the bit lines, wherein, in performing a refresh operation for recovering deterioration of a first logical data of the memory cells and deterioration of a second logical data of the memory cells, the number of the carriers accumulated in the floating body of the memory cell storing the second logical data is smaller than that of the memory cell storing the first logical data, in the refresh operation, the number of carriers injected into the floating body is larger than the number of majority carriers discharged from the floating body when a potential at the floating body is larger than a critical value, and the number of carriers injected into the floating body is smaller than the number of carriers discharged from the floating body when the potential at the floating body is smaller than the critical value.

9. The semiconductor storage device according to claim 8, wherein one of the bit lines includes local bit lines and a global bit line, the local bit lines being connected to the memory cells, the global bit line being connected to the local bit lines, the global bit line being connected to a sense amplifier, and the semiconductor storage device further comprises switching elements which are respectively provided between the local bit lines and the global bit line.

10. The semiconductor storage device according to claim 8, further comprising a bit line selector which is provided between a sense amplifier and the bit lines, the bit line selector selecting one bit line from the bit lines to connect the selected bit line to the sense amplifier in a data read operation or data write operation, wherein the bit line selector selects all or a plurality of bit lines from the bit lines to connect the selected bit lines to the sense amplifier in the refresh operation.

* * * * *